United States Patent
Halabe et al.

(10) Patent No.: US 11,899,161 B2
(45) Date of Patent: Feb. 13, 2024

(54) OPTIMIZATION UNDER UNCERTAINTY FOR INTEGRATED MODELS

(71) Applicant: Schlumberger Technology Corporation, Sugar Land, TX (US)

(72) Inventors: Vijaya Halabe, Katy, TX (US); William J. Bailey, Somerville, MA (US); Michael David Prange, Somerville, MA (US); Trevor Graham Tonkin, Swindon (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 1077 days.

(21) Appl. No.: 15/771,664

(22) PCT Filed: Oct. 25, 2016

(86) PCT No.: PCT/US2016/058559
§ 371 (c)(1),
(2) Date: Apr. 27, 2018

(87) PCT Pub. No.: WO2017/074883
PCT Pub. Date: May 4, 2017

(65) Prior Publication Data
US 2018/0321421 A1 Nov. 8, 2018

Related U.S. Application Data

(60) Provisional application No. 62/247,073, filed on Oct. 27, 2015.

(51) Int. Cl.
*G01V 99/00* (2009.01)
*E21B 41/00* (2006.01)
(Continued)

(52) U.S. Cl.
CPC ............ *G01V 99/005* (2013.01); *E21B 41/00* (2013.01); *E21B 43/00* (2013.01); *G01V 1/30* (2013.01);
(Continued)

(58) Field of Classification Search
CPC ........ G01V 99/005; G01V 1/30; G01V 11/00; G06F 30/20; G06F 30/23; E21B 41/00; E21B 43/00
See application file for complete search history.

(56) References Cited

U.S. PATENT DOCUMENTS 8,793,111 B2 7/2014 Tilke et al.
9,223,042 B2 12/2015 Maucec et al.
(Continued)

FOREIGN PATENT DOCUMENTS

WO 2013/106720 A1 7/2013

OTHER PUBLICATIONS

Rahim, Shahed, and Zukui Li. "Reservoir geological uncertainty reduction: an optimization-based method using multiple static measures." Mathematical Geosciences 47.4 (2015): 373-396. (Year: 2015).*

(Continued)

*Primary Examiner* — Boris Gorney
*Assistant Examiner* — Joshua E. Jensen
(74) *Attorney, Agent, or Firm* — Jeffrey D. Frantz

(57) ABSTRACT

A method can include receiving realizations of a model of a reservoir that includes at least one well where the realizations represent uncertainty in a multidimensional space; selecting a portion of the realizations in a reduced dimensional space to preserve an amount of the uncertainty; optimizing an objective function based at least in part on the selected portion of the realizations; outputting parameter values for the optimized objective function; and generating (Continued)

at least a portion of a field operations plan based at least in part on at least a portion of the parameter values.

19 Claims, 16 Drawing Sheets

(51) Int. Cl.
| | | |
|---|---|---|
| *G01V 11/00* | (2006.01) | |
| *E21B 43/00* | (2006.01) | |
| *G06F 30/20* | (2020.01) | |
| *G06F 30/23* | (2020.01) | |
| *G01V 1/30* | (2006.01) | |

(52) U.S. Cl.
CPC .............. *G01V 11/00* (2013.01); *G06F 30/20* (2020.01); *G06F 30/23* (2020.01); *G01V 2210/665* (2013.01); *G01V 2210/74* (2013.01)

(56) References Cited

U.S. PATENT DOCUMENTS

| | | | |
|---|---|---|---|
| 9,523,275 B2* | 12/2016 | Ma .......................... | E21B 49/00 |
| 2010/0332442 A1 | 12/2010 | Goel et al. | |
| 2011/0054869 A1 | 3/2011 | Li et al. | |
| 2011/0307230 A1* | 12/2011 | Lee ........................ | G01V 99/00 |
| | | | 703/10 |
| 2012/0118637 A1 | 5/2012 | Wang et al. | |
| 2012/0323544 A1 | 12/2012 | Zhao et al. | |
| 2013/0238303 A1* | 9/2013 | Round .................... | G06F 30/20 |
| | | | 703/6 |
| 2015/0055436 A1* | 2/2015 | Ma .......................... | G01V 1/30 |
| | | | 367/25 |
| 2015/0134304 A1* | 5/2015 | Guiver ................. | G06Q 10/107 |
| | | | 703/2 |
| 2015/0285944 A1* | 10/2015 | Herron ................... | G01V 5/101 |
| | | | 250/269.6 |
| 2015/0355353 A1* | 12/2015 | Whitaker ............... | G01V 1/345 |
| | | | 702/14 |
| 2016/0356125 A1* | 12/2016 | Bello ...................... | E21B 43/14 |
| 2016/0357887 A1* | 12/2016 | Ortiz ....................... | E21B 41/00 |
| 2017/0083822 A1* | 3/2017 | Adendorff .............. | G07C 5/006 |

OTHER PUBLICATIONS

Bertoncello, Antoine, and Jef Caers. "Global sensitivity analysis on a hybrid geostatistical model using a distance-based approach." Published at least by Jun. 20, 2015. https://web.archive.org/web/20150620072811/https://pangea.stanford.edu/departments/ere/dropbox/scrf/documents/reports/23/ (Year: 2015).*

[Item V continued] SCRF2010_Report23/SCRF2010_14.Antoine_sensitivity%20analysis_scrf21010.pdf (Year: 2015).*

Scheidt, Celine, and Jef Caers. "Uncertainty quantification in reservoir performance using distances and kernel methods—application to a west africa deepwater turbidite reservoir." SPE Journal 14.04 (2009): 680-692. (Year: 2009).*

International Preliminary Report on Patentability for the equivalent International patent application PCT/US2016/058559 dated May 11, 2018.

International Search Report and Written Opinion for the equivalent International patent application PCT/US2016/05859 dated Jan. 31, 2017.

Decker S. et al., "A 256X256 Imaging Array with Wide Dynamic Range Pixels and Column-Parallel Digital Output", Institute of electrical and electronics engineers University of Pennsylvania, IEEE, 1998, 10 pages.

Exam Report issued in Canada Patent Application 3,004,112 dated Dec. 7, 2022, 4 pages.

Office Action issued in Norway Patent Application No. P28581NO00 dated Feb. 8, 2023, 6 pages.

* cited by examiner

400

| 0 | ECL_Res1_BASECASE |
|---|---|
| 1 | ECL_Res1_Case_1 |
| 2 | ECL_Res1_Case_2 |
| 3 | ECL_Res1_Case_3 |
| 4 | ECL_Res1_Case_4 |
| 5 | ECL_Res1_Case_5 |
| 6 | ECL_Res1_Case_6 |
| ... | ECL_Res1_Case_ ... |
| n | ECL_Res1_Case_n |

| Case 0 | 0.028 |
| Case 1 | 0.111 |
| Case 2 | 0.028 |
| Case 3 | 0.111 |
| Case 4 | 0.444 |
| Case 5 | 0.111 |
| Case 6 | 0.028 |
| Case 7 | 0.111 |
| Case 8 | 0.028 |

Fig. 10

OPTIMIZATION UNDER UNCERTAINTY FOR INTEGRATED MODELS

RELATED APPLICATIONS

This application is a National Stage Entry of International Application No. PCT/US2016/058559, filed 25 Oct. 2016, which claims priority to and the benefit of a U.S. Provisional Application having Ser. No. 62/247,073, filed 27 Oct. 2015, each of which is incorporated by reference herein.

BACKGROUND

In oilfield operations, computer models of wells are employed to track and predict production. These models may be employed, for example, to determine the economical value for different well production scenarios. Furthermore, the parameters of several wells in a field may depend on one another, and thus computer models of the reservoir, including several wells, may be provided. The reservoir models may be employed to simulate and predict the effects of different production and/or other equipment parameters on the reservoir, and thus, for example, may be used to maximize the economical value of the reservoir or field. A model or models can include some amount of uncertainty, which may be classified as a level of uncertainty as depending on various factors. Uncertainty can be a factor in decision making, development of a reservoir or reservoirs, operation of equipment, etc.

SUMMARY

A method can include receiving realizations of a model of a reservoir that includes at least one well where the realizations represent uncertainty in a multidimensional space; selecting a portion of the realizations in a reduced dimensional space to preserve an amount of the uncertainty; optimizing an objective function based at least in part on the selected portion of the realizations; outputting parameter values for the optimized objective function; and generating at least a portion of a field operations plan based at least in part on at least a portion of the parameter values. A system can include a processor; memory accessible by the processor; processor-executable instructions stored in the memory and executable to instruct the system to: receive realizations of a model of a reservoir that includes at least one well where the realizations represent uncertainty in a multidimensional space; select a portion of the realizations in a reduced dimensional space to preserve an amount of the uncertainty; optimize an objective function based at least in part on the selected portion of the realizations; output parameter values for the optimized objective function; and generate at least a portion of a field operations plan based at least in part on at least a portion of the parameter values. One or more computer-readable storage media can include processor-executable instructions to instruct a computing system to: receive realizations of a model of a reservoir that includes at least one well wherein the realizations represent uncertainty in a multidimensional space; select a portion of the realizations in a reduced dimensional space to preserve an amount of the uncertainty; optimize an objective function based at least in part on the selected portion of the realizations; output parameter values for the optimized objective function; and generate at least a portion of a field operations plan based at least in part on at least a portion of the parameter values. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 4 illustrates each reservoir having a base case and multiple realizations, according to an embodiment.

FIG. 10 illustrates a table showing results of simulations per trial in optimization, with each simulation run's objective function accounted for, according to an embodiment.

DETAILED DESCRIPTION

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Figure 1:
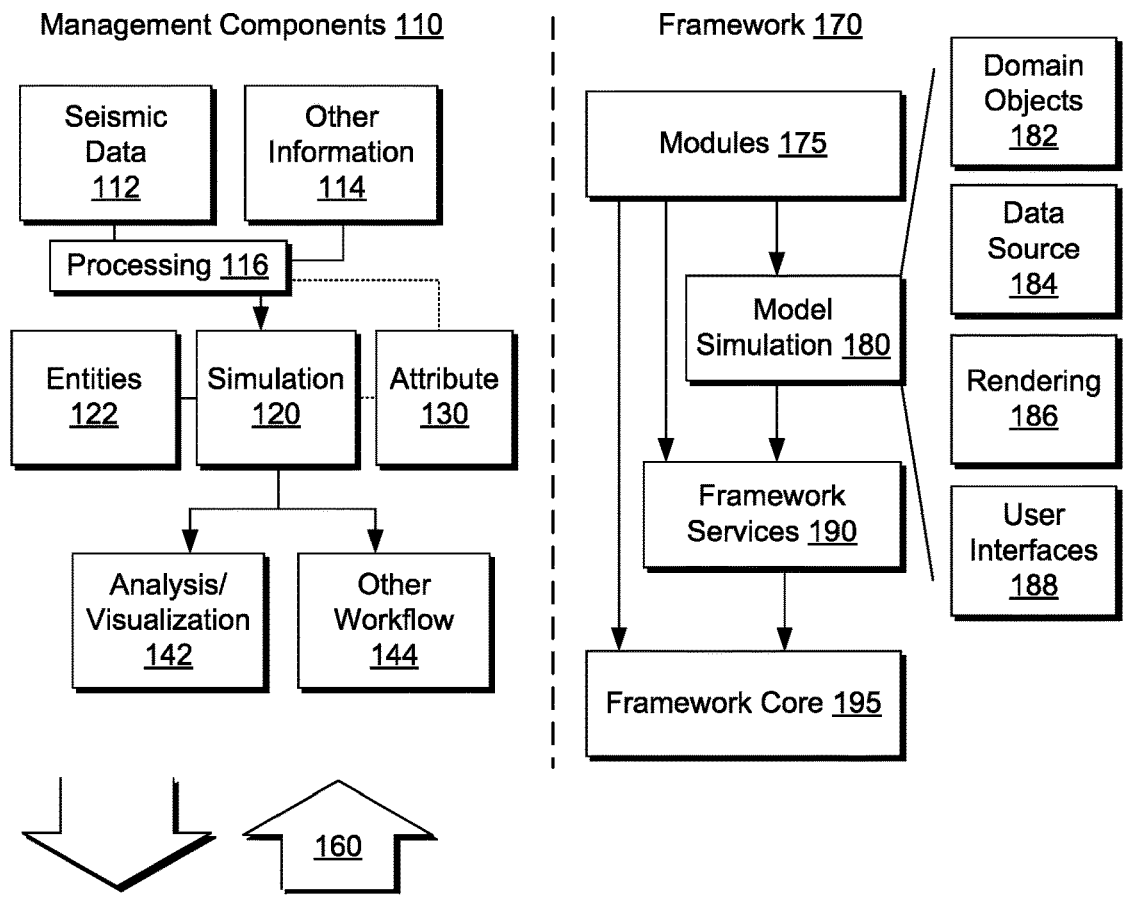
FIG. 1 illustrates an example of a system that includes various management components to manage various aspects of a geologic environment, according to an embodiment.
Figure 1:
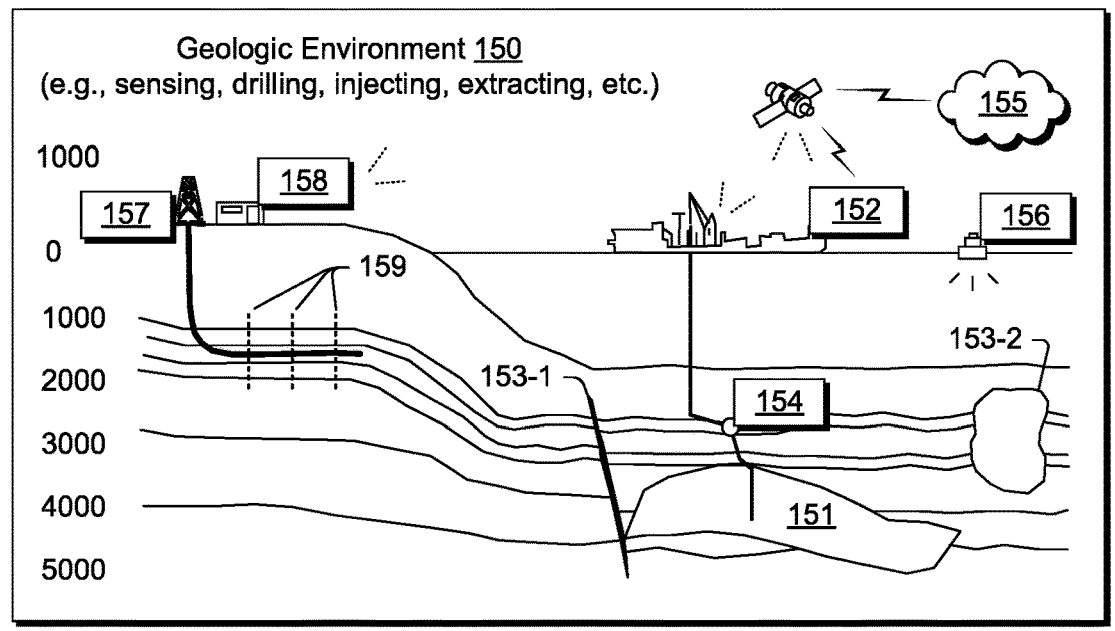

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET® framework (Redmond, Washington), which provides a set of extensible object classes. In the .NET® framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (Schlumberger Limited, Houston Texas), the INTERSECT™ reservoir simulator (Schlumberger Limited, Houston Texas), etc. As an example, a simulation component, a simulator, etc., may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Texas). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Texas) allows for integration of add-ons (or plug-ins) into a PETREL® framework workflow. The OCEAN® framework environment leverages .NET® tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or instead include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc., for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

As mentioned, a model or models can include some amount of uncertainty, which may be classified as a level of uncertainty as depending on various factors. Uncertainty can be a factor in decision making, development of a reservoir or reservoirs, operation of equipment, etc. As an example, a method can include evaluating and selecting production parameters (e.g., parameter values) under uncertainty pertaining to a model or models (e.g., consider an integrated model of various sub-models), which may model flow in one or more reservoirs, wells, networks, facilities, etc. As an example, an economic model may be operatively coupled to one or more other models, for example, a production model may be coupled to an economic model to assess economics of production of hydrocarbons from one or more reservoirs. Such an example may consider, for example, one or more of a surface network, a separation facility, a processing facility, transportation, etc.

Figure 2:
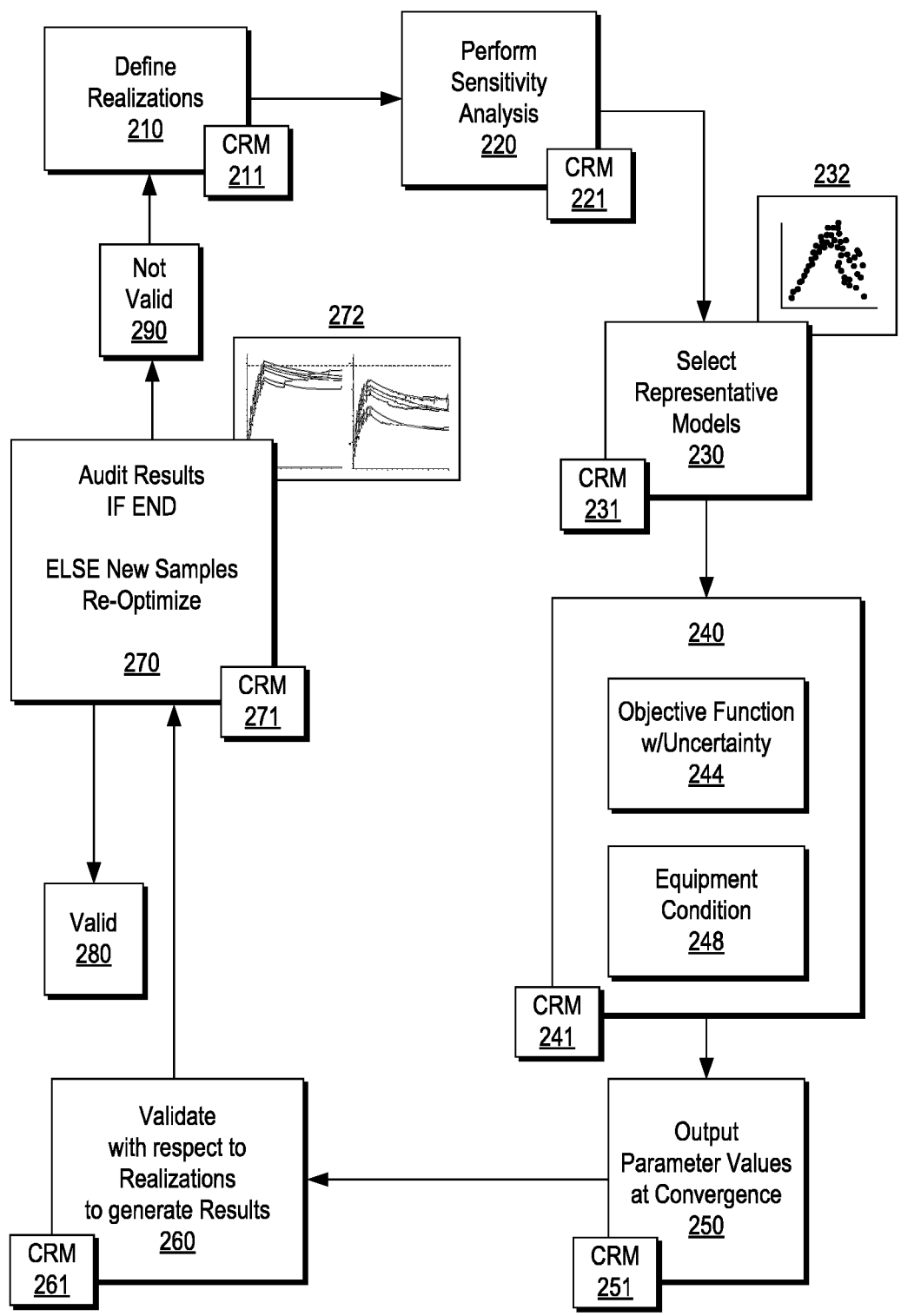
FIG. 2 illustrates a flowchart of a method, according to an embodiment.

FIG. 2 illustrates a flowchart of an example of a method 200 according to an embodiment. As shown, the method 200 includes a definition block 210 for defining realizations with respect to a reservoir or reservoirs in a geologic environment as created via a modeling framework, a performance block 220 for performing a sensitivity analysis on the defined realizations as may be represented by individual models, a selection block 230 for selecting a set of representative models (e.g., realizations) based at least in part on the sensitivity analysis such that a desired amount of uncertainty is represented, an optimization block 240 for optimizing an objective function that accounts for uncertainty 244 and optionally equipment condition 248 (e.g., equipment maintenance, failure, etc.) where the objective function is based on parameter values, an output block 250 for outputting a parameter values at convergence of the optimizing of the optimization block 240, a validation block 260 for validating the parameter values with respect to the realizations to generate results, an audit block 270 for auditing the results where, if the audit is acceptable, the method 200 continues to a valid block 280 that indicates that the results are acceptably valid and where, if the audit is unacceptable, the method 200 continues to a not valid block 290 and then to the definition block 210 for generating additional realizations, which can provide for new representative models per the selection block 230 (e.g., new samples).

The method 200 can be associated with various computer-readable media (CRM) blocks 211, 221, 231, 241, 251, 261, and 271. Such blocks generally include instructions suitable for execution by one or more processors (or cores) to instruct a computing device or system to perform one or more actions. As an example, a single medium may be configured with instructions to allow for, at least in part, performance of various actions of the method 200. As an example, a computer-readable medium (CRM) may be a computer-readable storage medium that is non-transitory and not a carrier wave and not a signal.

As shown in FIG. 2, the audit block 270 is shown next to a series of plots 272, which may be generated as to optimism and/or pessimism. For example, realization-based results may be generated for an objective to maximum cumulative production of hydrocarbons from one or more reservoirs. In such an example, one strategy may involve boosting (B) and another strategy may involve gas lift (GL) where the most optimistic boosting strategy may be compared to the most optimistic gas lift strategy to determine a strategy to implement to produce hydrocarbons from the one or more reservoirs, which may be over a period of years (e.g., optionally a decade or more).

As an example, a method such as the method 200 of FIG. 2 can include simulating one or more physical phenomena. For example, a reservoir simulator can be utilized to simulate physical phenomena such as fluid flow from a reservoir to a well or wells. As an example, one or more simulators may be implemented for one or more analyses. As an example, a simulator may implement a finite element model, a finite difference model, a pillar grid model, a volume cell model, etc. As an example, a model may be a dynamic model. As an example, a model may be a static model (e.g., a steady-state model). As an example, a reservoir model may be operative coupled to a surface network model, which may be coupled to one or more facilities models. As an example, a model may be an integrated model that includes various models with coupling(s). As an example, a model can include one or more equipment models such as, for example, a model for an electric submersible pump, a compressor, etc. As an example, equipment can include subsurface equipment (e.g., disposed in a borehole, wellbore, etc.) and/or surface equipment.

As an example, a method can include accessing one or more performance tables that may include data generated by one or more model-based simulators. In such an example, a performance table may be generated prior to an optimization and/or prior to a sensitivity analysis. As an example, a model may be a history match material balance model. As an example, a model may be a simplified reservoir model, for example, a model that may be a simplified version of an ECLIPSE® reservoir model or an INTERSECT™ reservoir model. As an example, a model may be honed to reduce run-time overhead.

As mentioned, by selecting particular representative realizations (e.g., models or instances of models), a method can reduce run-time overhead with respect to an optimization while preserving an amount of desired uncertainty, which may exist in a larger number of realizations (e.g., statistically generated such as by random number generation of property values, etc., that may populate cells of a model that include grid cells). As an example, a method can include running a preliminary optimization and then, based at least in part on parameter values from the preliminary optimization, running a more complex model (e.g., or integrated model) using a more accurate simulator (e.g., simulation framework such as, for example, ECLIPSE® framework, INTERSECT™ framework, etc.). As an example, a simplified model may be a production decline curve model for a well or wells, which may be based, for example, on reservoir pressure, which may decline over time as pressure in a reservoir drainage area decreases.

Various embodiments can include performing a method that accounts for sensitivity. For example, the performance block 220 of the method 200 can account for sensitivity. As an example, a method can include utilizing an automated optimization tool, for example, in a manner that utilizes a selection process that can account for uncertainty. In such an example, the selection process may be referred to selection under uncertainty utilizing smart sampling.

In the example of FIG. 2, the selection block 230 is shown along with an example plot 232 of models (e.g., instances of a model or realizations) in a reduced dimensional space, which may be a metric space. As an example, the selection block 230 can include applying a technique or techniques to reduce dimensionality of a multidimensional space associated with the defined realizations. As an example, a method can include performing a cluster analysis of points in a reduced dimensional space (e.g., a metric space) where, for example, points may be selected based at least in part on how the points are clustered. In such an example, individual points may be selected from corresponding individual clusters such that a selected number of representative models (e.g., instances of a model or realizations) may correspond to a number of clusters. As an example, a cluster analysis may include setting a threshold or thresholds as to a size (e.g., area) and/or a number of points to define a cluster.

As an example, a method may account for one or more decision-makers' tolerances to risk, for example, via a risk-aversion factor. In such an example, the risk-aversion factor can be tied to historical data as to various historic outcomes. For example, where particular risks are known to exist for development and/or production operations for a basin (e.g., oilfield), a risk-aversion factor range may be recommended and may be associated with particular types of favorable and unfavorable outcomes. In such an example, information may guide a user in selection of a risk-aversion factor. As an example, information may include risk sensitivity as to one or more entities and/or one or more mathematical models that account for production and cost.

As an example, various methods may account for reservoir uncertainty as well as surface network uncertainty, optionally in a manner that can accommodate equipment failures. For example, one or more of remaining life of available equipment, service schedules of various equipment and operational ranges of various types of equipment may be taken into account for equipment that can be utilized in one or more field operations. Such factors may be considered equipment condition factors such as indicated in the block 248 of the optimization block 240 of the method 200 of FIG. 2.

As an example, a method may be implemented in a manner that aims to reduce a number of uncertainty realizations via a smart sampling technique. For example, a solution may include a fewer number of uncertainty realizations through use of one or more smart sampling techniques (e.g., smart selection techniques) that may create "clusters" and extract a representative member of each cluster. As an example, a sampling or selecting technique can include dimensional reduction such that a number of variables (e.g., parameters, etc.) are reduced to a fewer number in a multidimensional space (e.g., two-dimensional or three-dimensional) where sampling or selecting can be performed with at least some assurances of adequately accounting for a desired amount of uncertainty, etc.

As an example, a method can include modeling a complex field development in a manner that includes creating an integrated asset model for coupling reservoir models containing wells with network models, and then interacting this with facilities and an economic model or models at specified points in the system (e.g., boundary conditions).

As an example, in various embodiments, a method or methods may facilitate evaluation of an integrated model, for example, capturing uncertainty in a reservoir and an associated fluid flow network. As an example, consider a method that includes the following enumerated activities. A method may include a definition block for defining uncertainty and optimization (U&O) reservoir realizations, which may be generated in a seismic to simulation framework such as the PETREL® framework. Such realizations may be referred to as simulation cases.

A method may commence by creating one or more reservoir simulation scenarios within a reservoir modeling framework (e.g., the PETREL® framework, etc.) using an uncertainty and optimization workflow.

Figure 3:
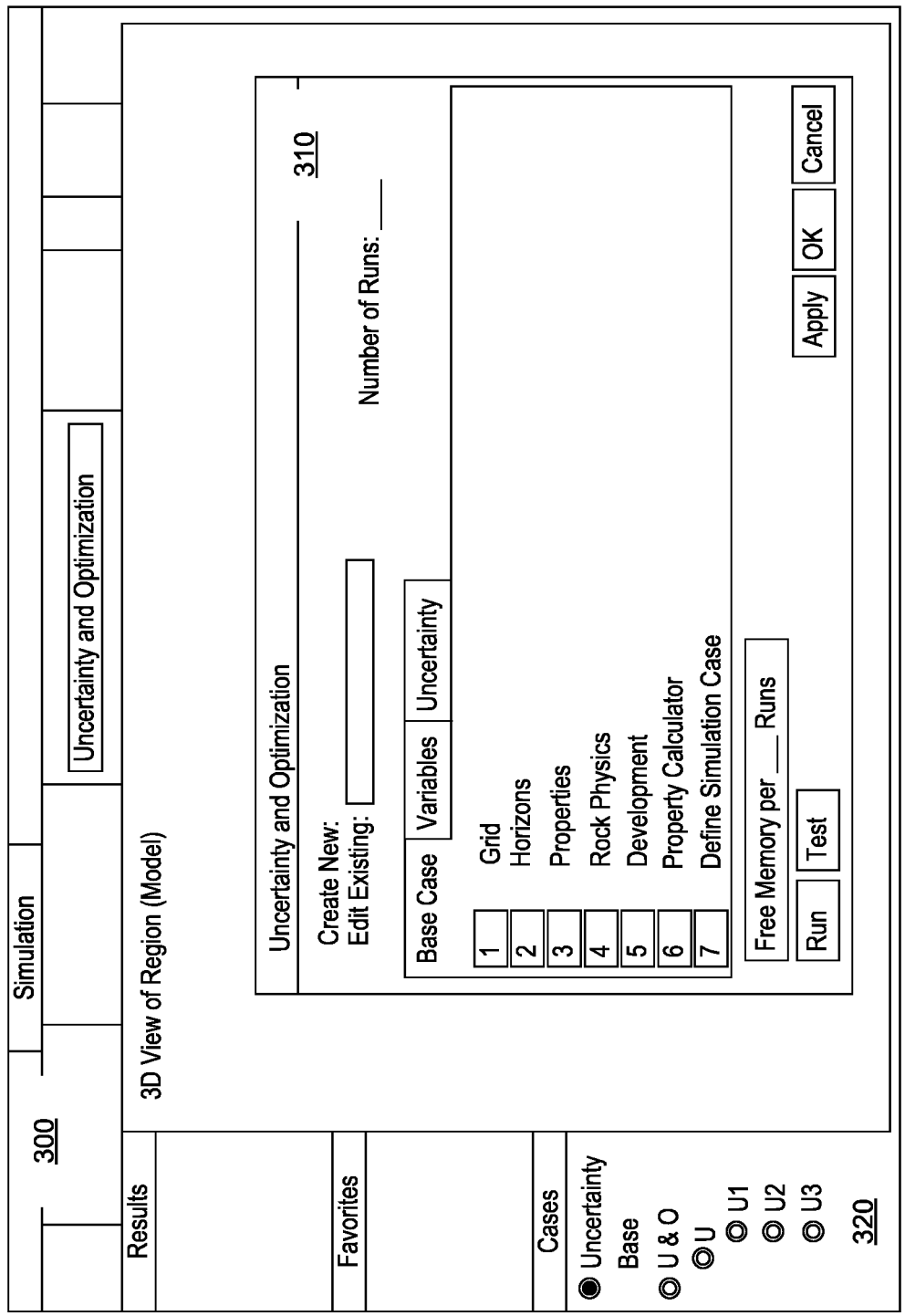
FIG. 3 illustrates an example of creating reservoir simulation scenarios, according to an embodiment.

FIG. 3 shows examples of graphical user interfaces (GUIs) 300, 310 and 320 as associated with a framework that can perform at a least a portion of the method 200 of FIG. 2. As shown in FIG. 3, the GUI 300 includes a simulation graphic control and an uncertainty and optimization graphic control that may be selectable to cause rendering of the GUIs 310 and/or 320. The GUI 310 includes various graphic controls and fields for base case definition, variables definition, uncertainty definition, etc. The GUI 310 also includes a run button, a test button and a free memory graphic control that may allow for releasing memory during a simulation run (e.g., after a number of iterations, a number of runs, etc.). As to the GUI 320, radio button graphic controls are shown as including cases for uncertainty, particularly uncertainty and optimization (U & O). As shown, various uncertainty cases may be generated.

As an example, the GUI 300 may be a GUI of an uncertainty and optimization framework, which may be, for example, part of or operatively coupled to a framework such as the PETREL® framework. In such an example, a number of realizations may be generated (e.g., instances of a grid cell model) and simulations run to generate results for the realizations. As an example, such results may be part of a sensitivity analysis. As an example, a method can include sensitivity and uncertainty analysis and, for example, generating probabilistic forecasts and/or optimizing operational parameter values, which may be implemented for field development.

As an example, an individual reservoir may have a base case and multiple realizations, which may be created to capture asset-level uncertainty, such as one or more of:

Facies heterogeneity & distribution

Contacts: oil-water, gas-oil, multiple contacts

Rock property distributions (porosity, permeability in X, Y and Z directions etc.)

Faults & transmissibility barriers

Fluid properties (PVT).

FIG. 4 shows an example of a table 400, which may be a graphical user interface (GUI) or part of a GUI. As shown, a number of realizations can be as small as two, depending upon how much uncertainty may be present in a particular reservoir under examination. As an example, a method can include importing these realizations into an asset management software application, such as an integrated asset management (IAM) platform (e.g., IAM framework, marketed by Schlumberger Limited, Houston, Texas), and conducting a sensitivity analysis on the reservoir realizations. For example, the performance block 220 of the method 200 can include receiving a number of realizations (e.g., two or more) and then performing one or more sensitivity analyses to generate sensitivity information.

As an example, realizations can be imported into an IAM platform and one or more sensitivity analyses carried out within these realizations. As an example, sensitivity information generated by the one or more sensitivity analyses may optionally be output in a reduced dimensional space.

Models tend to be complex, as is the subsurface, as they can include various elements of modeling, such as the modeling of its structures, the geological processes of growth and/or deposition, the placement, movement or injection/extraction of fluid and gaseous phases contained in the rocks. As such, models tend to be relatively high in their dimensionality, which may be described as a multidimensional space. As information provided by measurement data, whether from boreholes or geophysics, tends to be limited spatially, interpretations based on data may aim to fill gaps, which can be a source of uncertainty in modeling.

To account for uncertainty, a number of alternatives, referred to as realizations, can be generated that reflect an ensemble of various sources of uncertainty. However, the intrinsic variation between realizations can tend to be quite complex and challenging to reduce in terms of dimensionality.

As an example, an approach to characterize realizations (e.g., models) can include defining distances between models created with different (and possibly randomized) input parameter values. As an example, a distance can be selected to correlate with the difference in a target response between two models (e.g., two realizations). As an example, a distance can define a metric space with a relatively broad gamma of theory. As an example, a method can include redefining a modeling problem (e.g., model selection and screening) with uncertainty evaluation in metric space. Such an approach can increase effectiveness and efficiency where model and response uncertainty considerations are to be taken into account.

As an example, a method can include multidimensional scaling (MDS) to reduce dimensionality of models (e.g., realizations or instances of a model). In such an example, sampling (e.g., selecting) may occur in a reduced space. Such an approach may be referred to as smart sampling. As an example, an MDS approach may assess realizations as to similarity and/or differences. Such an approach may aim to preserve uncertainty in a selected number of realizations that is less than a generated number of realizations.

As an example, in a MDS approach, values plotted on an axis or axes may be without particular relevance, for example, as to an objective function associated with optimization. In an MDS approach, relative positions of realizations (e.g., models) with respect to one or more other realizations can be instructive in assessing how similar or how different two realizations may be, which can be useful information when accounting for uncertainty. As an example, a distance can be a Euclidean distance between locations of two realizations. As an example, an MDS approach may be implemented in a manner where a reduced dimensional space may be of the order of about 5 dimensions or less. For example, consider a four dimensional space, a three dimensional space or a two dimensional space. As an example, in some instances a one dimensional space may provide for "cluster" analysis where realizations may be clustered along a line.

As an example, a selection process may include dimensional reduction to present realizations (e.g., models or instances of a model) in a connectivity distance space. As an example, one or more kernel techniques may be utilized to transform from one metric space into a different metric space such that after projecting in 2D, 3D, etc., clusters may be generated. As an example, one or more techniques may be applied such as clustering, principle component analysis (PCA), regression, etc., in a reduced space, optionally without knowledge of a Cartesian space. As an example, a transformation may be utilized to transform from a metric space to another metric space. Variability between realizations (e.g., models or instances of a model) may be more readily discerned via such a transform. As an example, a MDS approach can transform a non-Euclidean distance into an approximating Euclidean distance. As an example, a method can link Euclidean distances, Gaussian variables and kernels (e.g., radial basis function kernels, etc.). As an example, a kernel function can simplify variability in a metric space defined by approximated Euclidean distances. As an example, a distance may be a construct that captures a difference between two realizations where the distance is not itself a measure (e.g., not a length).

Figure 5:
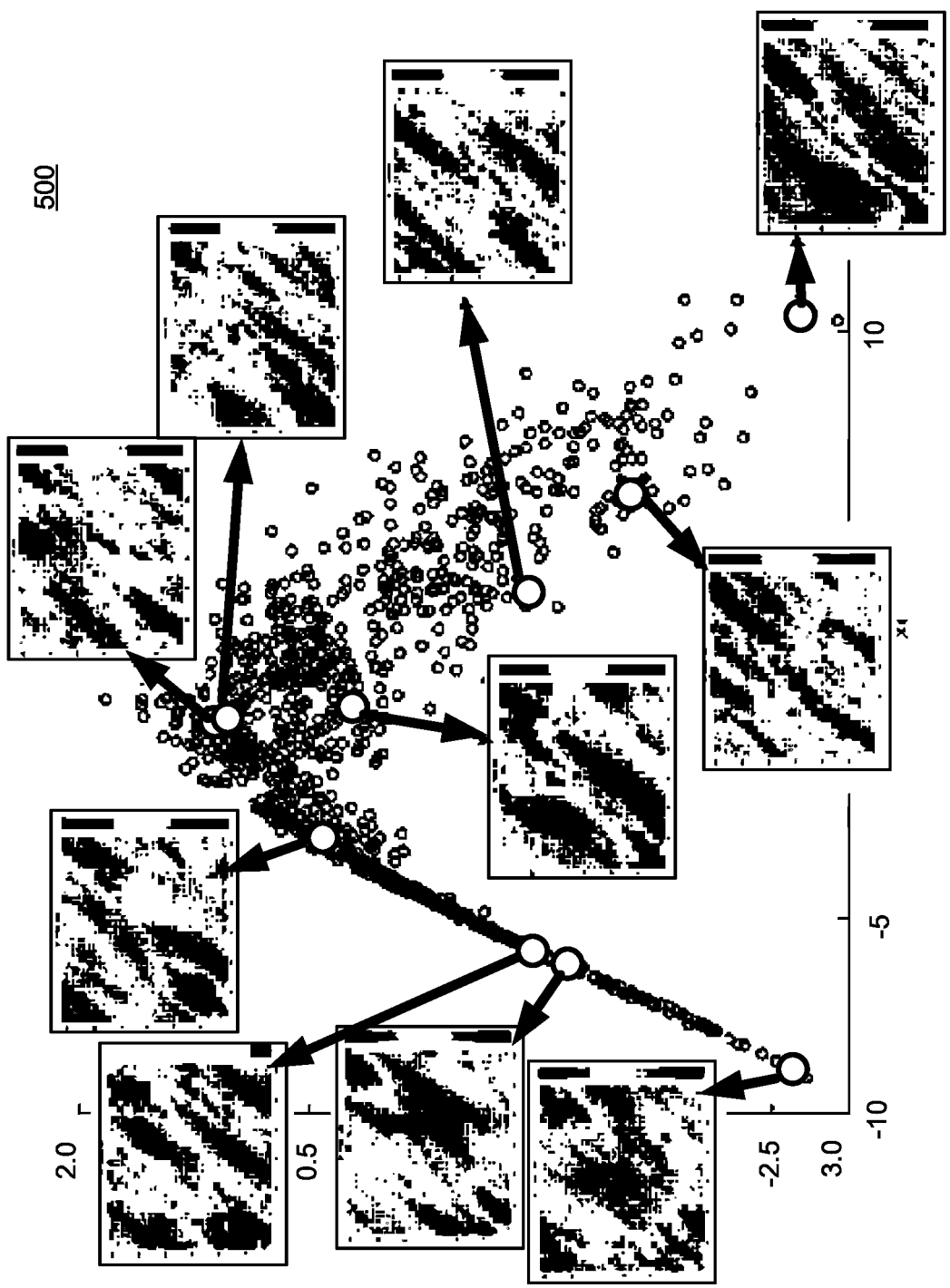
FIG. 5 illustrates a plot of sensitivity analysis carried out in the realizations, according to an embodiment.

FIG. 5 shows an example plot 500 of realizations and associated two-dimensional coordinates for each of the realizations in a two-dimensional space. In such a space, a method can include selecting representative uncertain reservoir realizations for carry-through into optimization (e.g., smart sampling). As an example, the selection block 230 of the method 200 of FIG. 2 can include dimensional reduction at least in part via multidimensional scaling (MDS).

In particular, the plot 500 shows a plurality of models (e.g., realizations), which may be, for example, Gaussian models, as individual plots where each of the individual plots has a corresponding location in a reduced dimensional space, which may be referred to as a metric space. In the metric space, a distance (e.g., connectivity distance) can exist that characterizes similarity of the models. The models shown in the individual plots of the plot 500 correspond to selected models where selection of that portion of the total number of models represented is based on how those models are located in the metric space. As an example, a projection technique may be applied to project a cloud of models from one space to a new space to facilitate selection. As an example, a method can include transforming from a feature space to a metric space. As an example, a method can include transforming from a metric space to another metric space.

In the example plot 500, each of the plots can correspond to selected reservoir models where, for example, porosity in each of the models can differ (e.g., each reservoir model being a grid cell model with porosity values assigned to each of the grid cells of the model). In such an example, each model can be a realization or an instance of the grid cell model where the porosity values differ in a manner that is based at least in part on uncertainty as to porosity in the grid cell model. Such models (e.g., instances of the grid cell model) can exist in a high dimensional space where a technique such as MDS can reduce those models to points in a lower dimensional space (e.g., a 2D space). Distances between the points can be distances in a least-squared sense that represent similarity or lack thereof between the models (e.g., instances of the grid cell model or realizations).

As an example, after plotting sensitivity information from realizations, a method may include selecting a reduced, but representative, number of samples for optimization purposes based on what are potentially long computational times of the simulator.

As an example, smart sampling can be a way to achieve this by identifying clusters, as shown in FIG. 5. For example, one or more clusters can be identified in a reduced space and samples extracted such that a representative member of each cluster is selected to generate a representative set of samples (e.g., a representative set of models or realizations).

As an example, the selection block 230 of the method 200 of FIG. 2 can reduce the number of realizations that may then be used as representative samples for an optimization. Per the plot of FIG. 5, such representative samples can be selected with some assurances that they cover a broad range of cases in an uncertainty space (e.g., the two-dimensional plotted space of the plot 500 of FIG. 5). As an example, smart sampling (or screening) may include using one or more other sampling techniques such as Latin hypercube, polynomial chaos, etc.

As explained with respect to the block 248 of the method 200 of FIG. 2, a method can optionally include defining equipment-run-life failure expectations in a wellbore, a surface network and associated facilities. For example, these factors may be declared as survival curves which may be single, expected estimates or an ensemble using confidence intervals straddling these expected survival curves.

Figure 6:
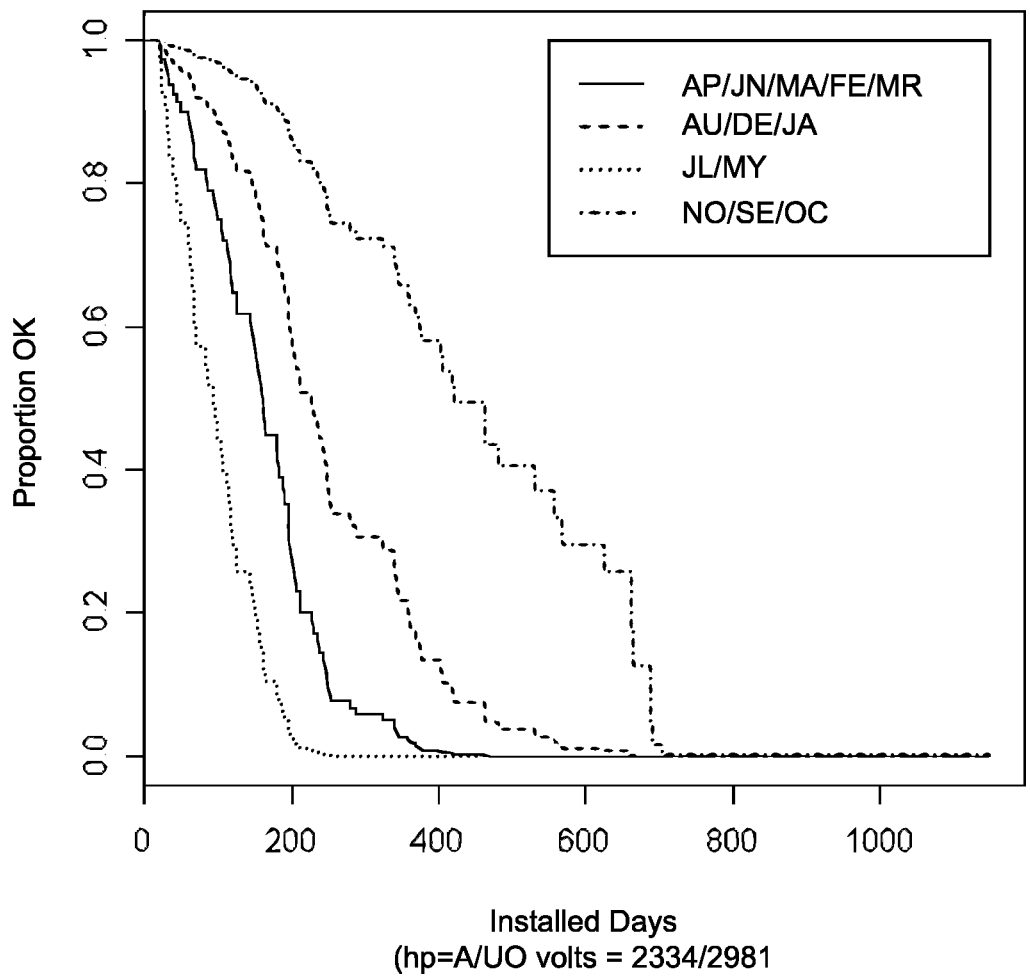
FIG. 6 illustrates a plot of survival curves that document the expected run-life failure for equipment after installation, according to an embodiment.

In a surface network model, survival curves for equipment may be defined as shown in an example plot 600 of FIG. 6. Such survival curves can document the expected run-life failure for equipment after installation. The plot 600 may be generated for different elements and aspects of equipment, whether for a surface network, downhole, facilities, transport, etc.

In FIG. 6, the plot 600 shows Cox Proportional Hazard (CPH) equipment curves and the proportion of equipment that remains operationally "OK" (e.g., usable) with respect to time. As an example, one or more of CPH, Kaplan-Meier (KM) or another type of modeling approach may be utilized to analyze and/or to characterize equipment.

As to optimization, for example, per the optimization block 240 of the method 200 of FIG. 2, when running an optimization, random equipment failure may be penalized through one or more time steps of a simulation. For example, equipment failure may be taken into account at each time step via increments and/or via one or more less frequent time steps via an increment, increments or other type of degradation condition (e.g., failure, etc.).

As an example, a method can include run an optimization under uncertainty in a manner that includes combining reservoir uncertainty with equipment failure. As an example, such an optimization may be performed in an integrated asset modeler framework (IAM framework). As an example, an optimization can consider a suitable objective function, which may be defined and/or modified by a user. As an example, an objective function may be directed to total production or net present value (NPV) of hydrocarbons based on a volume metric, a rate metric, etc.

Figure 7:
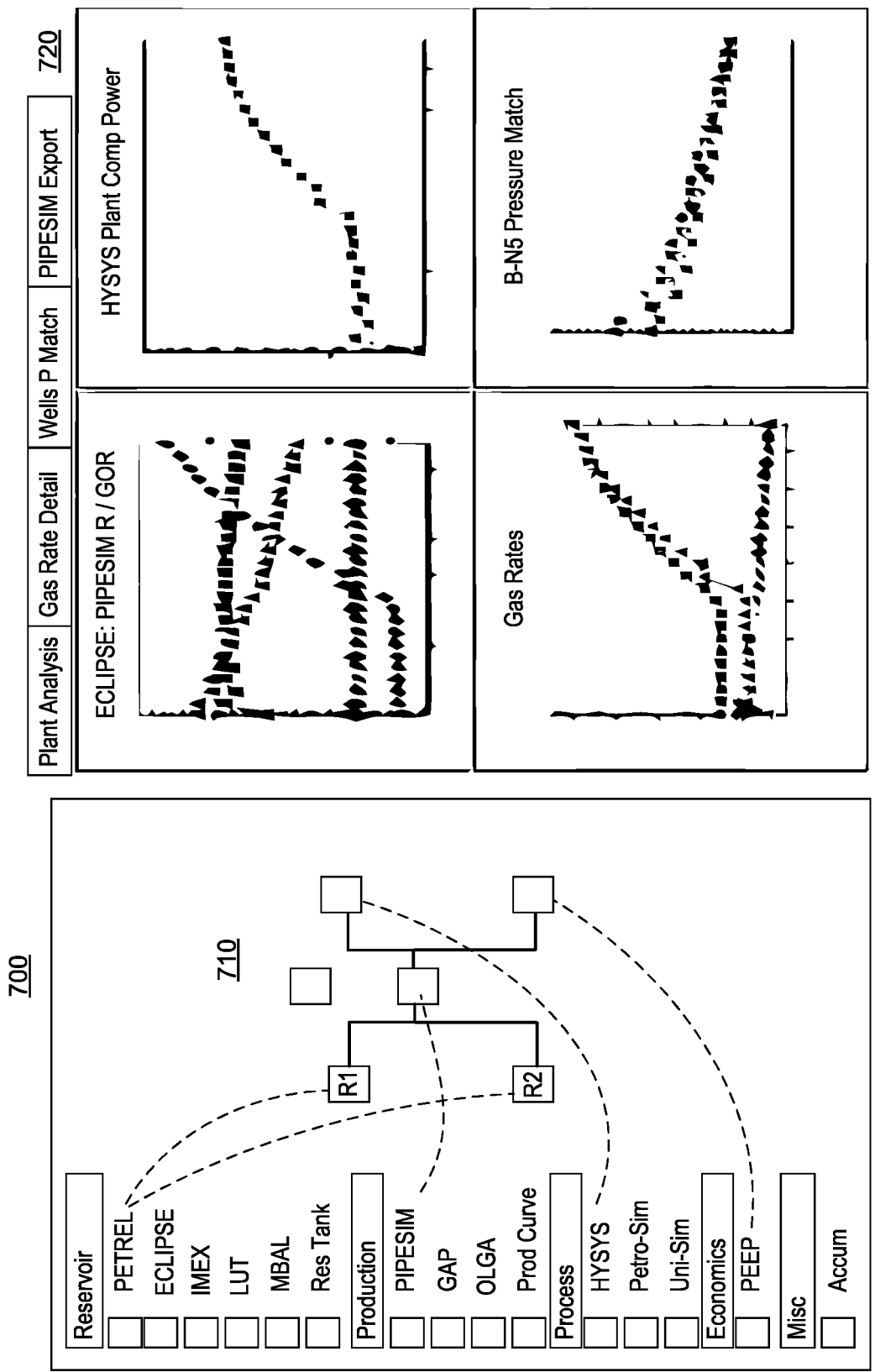
FIG. 7 illustrates creating an integrated model in a software platform, according to an embodiment.

As an example, once a reduced number of realizations from smart sampling or otherwise, are identified, a method may include bringing them into an integrated model in a framework (e.g., IAM framework). In such an example, first, a base case of each reservoir and surface network (e.g., optionally including failure probabilities) can be used to create an integrated model as shown in an example of a graphical user interface (GUI) 700 of FIG. 7, where a panel 710 (e.g., window of the GUI 700) shows that two reservoirs (e.g., PETREL® framework models) are connected to surface network model (e.g., a PIPESIM™ framework model), facility model and economics model (e.g., a PEEP™ framework model, Schlumberger Limited, Houston, Texas), followed by a validation of the resulting FDP.

The GUI 700 also shows various graphic controls 720 for selection and/or generation of graphs such as, for example, reservoir simulator and/or surface network simulator rates (e.g., GOR, etc.), gas rates, pressure matches, plant power consumption (e.g., compressor power for gas, etc.).

As an example, the IAM framework can achieve more accurate forecasts by accounting for the interactions of subsurface deliverability with surface backpressure constraints in model compositional blending, mixing, and injection of multiple producing zones and reservoirs to meet product specifications; optimize the use of artificial lift, EOR, and IOR injection; plan gas storage operations by predicting deliverability and optimizing compression design; control cross flow between sands using optimized inlet control valves in complex wells; and/or debottleneck pipeline network field processing facilities. As an example, the IAM framework can provide a production simulation environment that integrates asset details of a plurality of individual simulation models (e.g., of a reservoir or reservoirs, a well or wells, a surface infrastructure or infrastructures, a process facility or facilities). In such an example, the simulation environment can allow for logical connections, constraints, and optimization routines to be implemented so that the value of multiple development options or operating scenarios can be compared, maximized, etc.

Figure 8:
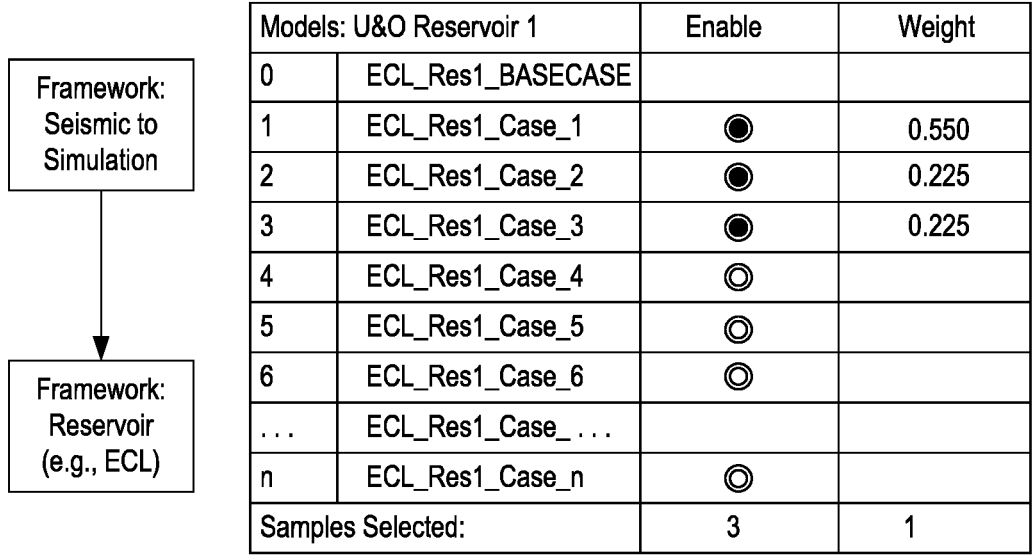
FIG. 8 illustrates selecting the reduced number of realizations from smart sampling and assigning weights to them according to the desired distribution, according to an embodiment.

FIG. 8 shows an example of a table 800 that may be a graphical user interface (GUI) that can be utilized to link models (e.g., reservoir models, such as suitable for a reservoir simulator such as the ECLIPSE® framework simulator). In such an example, a method may utilize such a table or GUI to select the reduced number of realizations from smart sampling and, for example, allow for assigning weights to the selected reduced number of realizations, for example, according to a desired distribution. Such a weighting process may be manually from expert input or computed from their respective distributions (e.g., automated or semi-automated).

Figure 9:
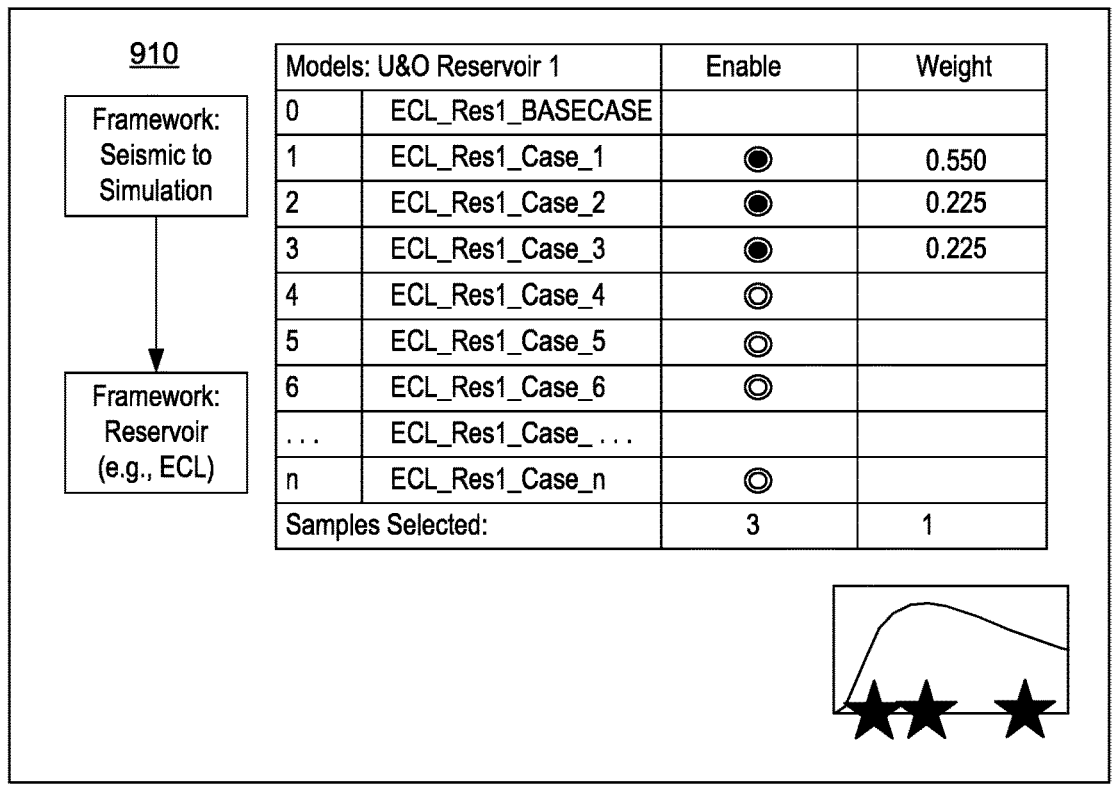
FIG. 9 illustrates two reservoirs (m=2) and three smart realizations for each reservoir (N=3), according to an embodiment.
Figure 9:
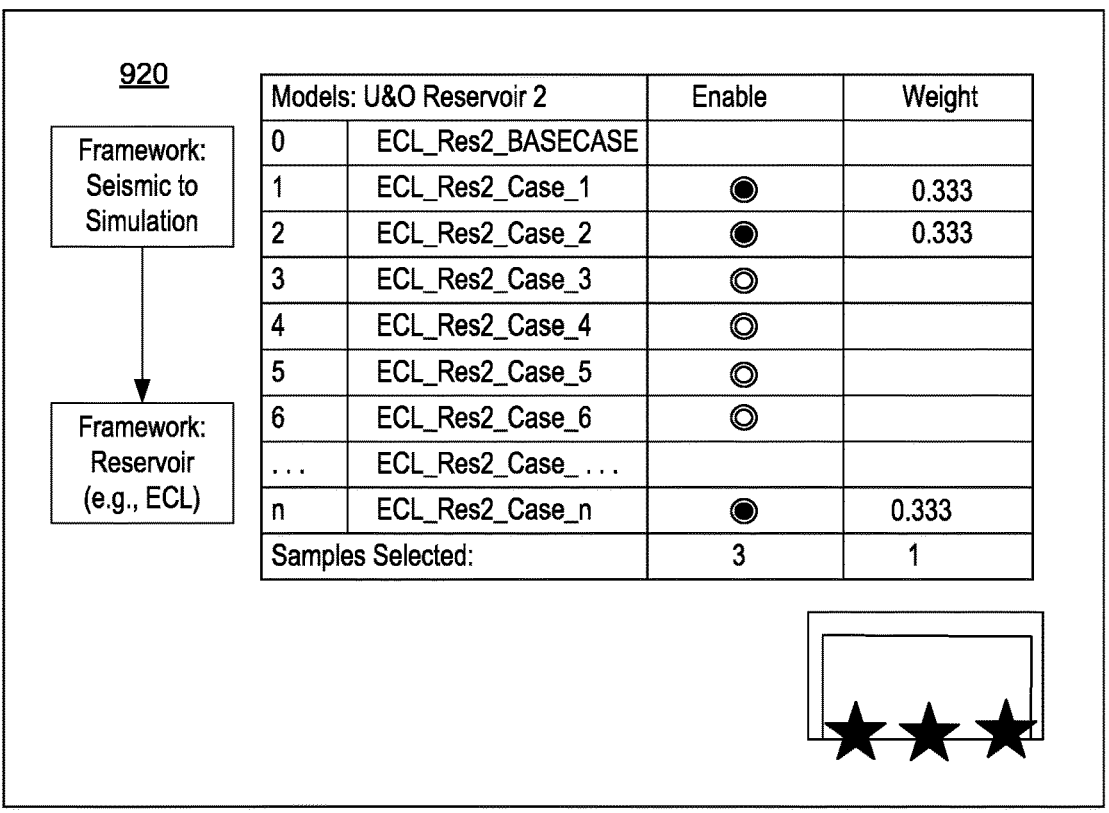

FIG. 9 shows examples of two graphical user interfaces (GUIs) 910 and 920 for each trial of the optimization that includes running each realization where the computed objective function accounts for the corresponding weight. For example, for the two reservoirs (m=2) and the three smart realizations for each reservoir (N=3), the weights can differ as can a selected number of cases. As mentioned, two reservoirs may be operatively coupled to a common surface network, for example, a surface network that includes at least some common surface equipment. Such a surface network may route hydrocarbons from wells to a common handling facility. As an example, where fluid is injected (e.g., liquid and/or gas) into a well and/or a formation, a surface network may route such fluid (or fluids) from one region to another (e.g., for gas lift, etc.).

In the example GUIs 910 and 920, the two reservoir scenario results in N*m=9 simulations per trial in the optimization, as shown in a table 1000 of FIG. 10, with each simulation run's objective function accounted for according to product of weightages, which are normalized to compute a final objective function of the trial.

As an example, if one or more equipment failures occur during a trial, the objective function of the corresponding realization may be penalized accordingly. As an example, a method can include establish an optimal operating strategy obtained upon optimization convergence in an IAM framework after accounting for risk. For example, the output block 250 of the method 200 of FIG. 2 can output parameter values for an optimization once the optimization has appropriately converged according to one or more convergence criteria (e.g., error, number of iterations, etc.).

As an example, for an optimization, an objective function may be, for example, a difference of cumulative oil production and cumulative water production; a net present value; a recover factor; another metric.

As mentioned, an objective function may be modified according to a risk-aversion factor ($\lambda$). Such a factor may be utilized to compute an objective function (e.g., $F=\mu\,\lambda\sigma$) when optimizing an objective function in the presence of uncertainty. In such an example, the factor $\lambda$ can provide a manner by which a user may establish (e.g., impart) a level of confidence to output parameter values. For example, by assuming that output parameter values are normally distributed, a method can include formulating a table such as Table 1, below, which includes confidence levels with for various values of user-defined (e.g., or user-selected, etc.) risk aversion, $\lambda$, as:

TABLE 1

| Value of Lambda, $\lambda$ (Risk Aversion Factor) | Degree of confidence at this value (assuming normal distribution of results) |
| --- | --- |
| 0 | 50.00% |
| 0.5 | 69.15% |
| 1.0 | 84.13% |
| 1.5 | 93.32% |
| 2.0 | 97.72% |
| 2.5 | 99.38% |
| 3.0 | 99.87% |

As an example, decision variables—to which the objective function is sensitive—may be defined as those that an optimizer varies to find an optimal solution to a problem. As an example, different decision variables may be employed for the optimization corresponding to a chosen Enhanced Oil Recovery (EOR) strategy such as: Artificial-lift screening; Gas-lift allocation; Booster-pump capacity; Dual lift, etc.

As an example, each optimization run can include multiple trials, which continue until a convergence tolerance (e.g., optionally specified by the user) is reached for a given objective function. Such an optimization workflow may be expedited by more rapid solution optimization schemes (more rapid convergence) and smart sampling capabilities. An optimized objective function value can be obtained corresponding to an optimized strategy in a final trial run as shown in example plots 1110 and 1120 of FIG. 11 where a solution space is illustrated in the plot 1110 that includes a surface and where values are plotted in the plot 1120 as to a desired optimization goal are illustrated in reaching an optimized solution (e.g., optimized parameter values).

Figure 11:
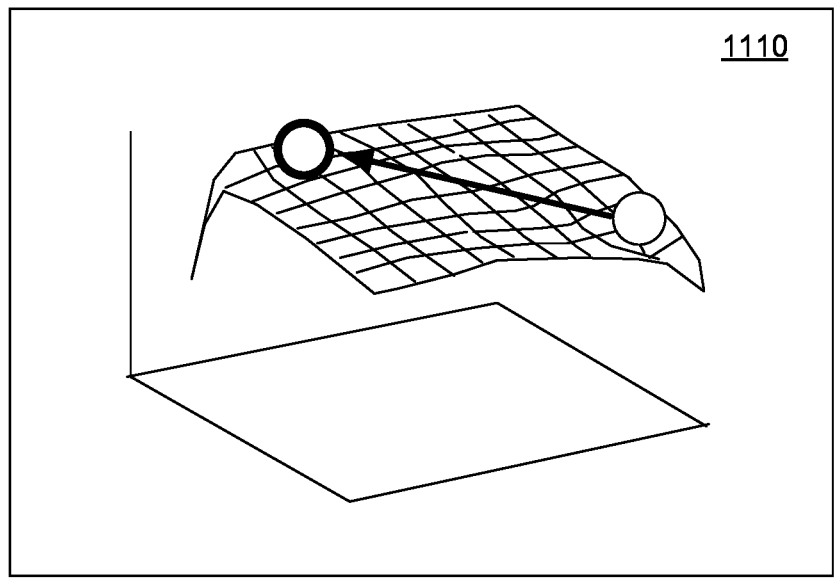
FIG. 11 illustrates a plot of an optimized objective function corresponding to a strategy, according to an embodiment.
Figure 11:
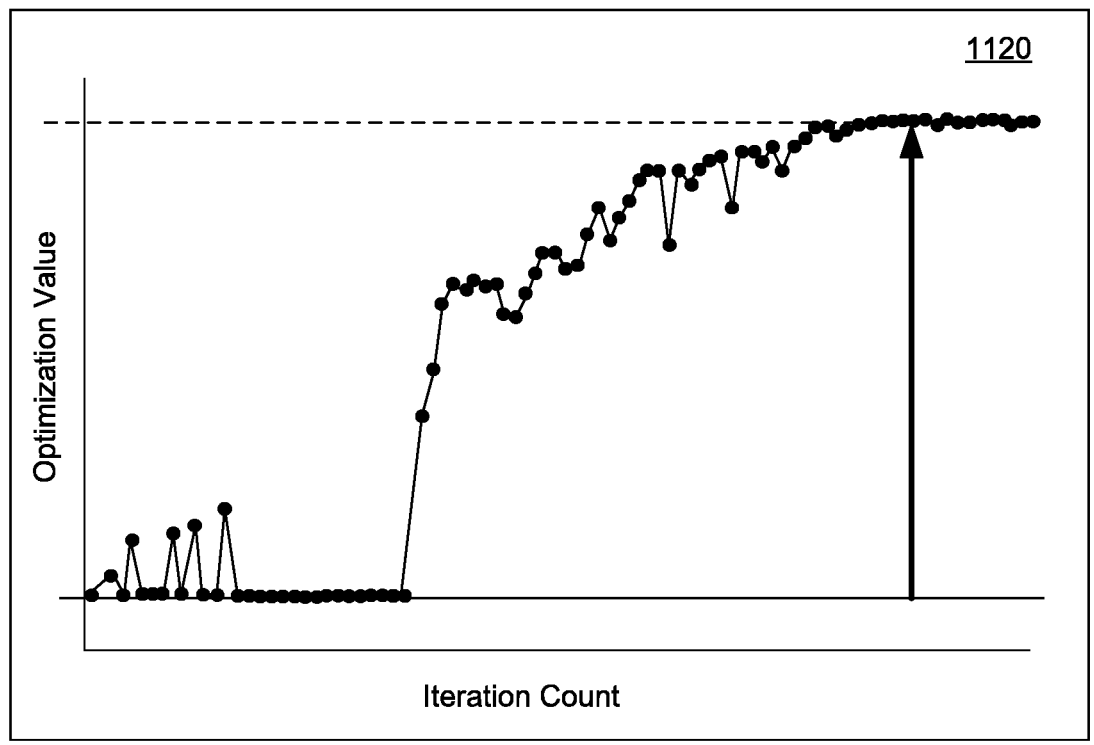

In the plots 1110 and 1120 of FIG. 11, the objective function is formulated to as cumulative oil production such that optimizing can optimize cumulative oil production. In such an example, decision variables included gas injection rates, water injection rates, producer rates, variation in injection rates, and completion zone for injectors. In the plot 1120, an arrow represents an increase in the objection function value where parameter values are optimized to maximize cumulative oil production. The plot 1110 shows an arrow and two markers where the arrow represents an overall increase in cumulative oil production with respect to an initial solution (e.g., initial set of parameter values) and an optimized solution (e.g., optimized set of parameter values). The path from one marker to the other may differ depending on the type of optimization algorithm utilized (e.g., not necessarily a straight line path in the plot 1110).

In the example of FIG. 11, the plot 1120 of objective function values versus trials demonstrates how interpretation and analysis accounts for uncertainty (e.g., as in simulations) to determine operational configurations and/or settings (e.g., parameter values). In the plot 1120, each marker represents a set of parameters values in an uncertainty space that gives rise to a corresponding level of production. Such an approach accounts for an amount of uncertainty that is preserved via selection of representative realizations (e.g., models or model instances), which may occur, for example, in a metric space that is generated at least in part by MDS.

As mentioned with respect to the method 200 of FIG. 2, the validation block 260 can provide for validating output parameter values with respect to realizations to generate results. For example, a validation process can include validating output parameter values of an optimizer where the parameter values represent an optimal strategy. In such an example, validating can include applying the optimal strategy to at least some of the realizations (e.g., at least a portion of the models). As an example, validating may apply the optimal strategy to each of the realizations and/or to each of the selected realizations (e.g., selected representative models).

As an example, a method can include validating an optimal strategy by using optimal parameter values for PETREL® U & O realizations. As an example, results generated from validating can be used to generate statistics and analysis curves.

Figure 12:
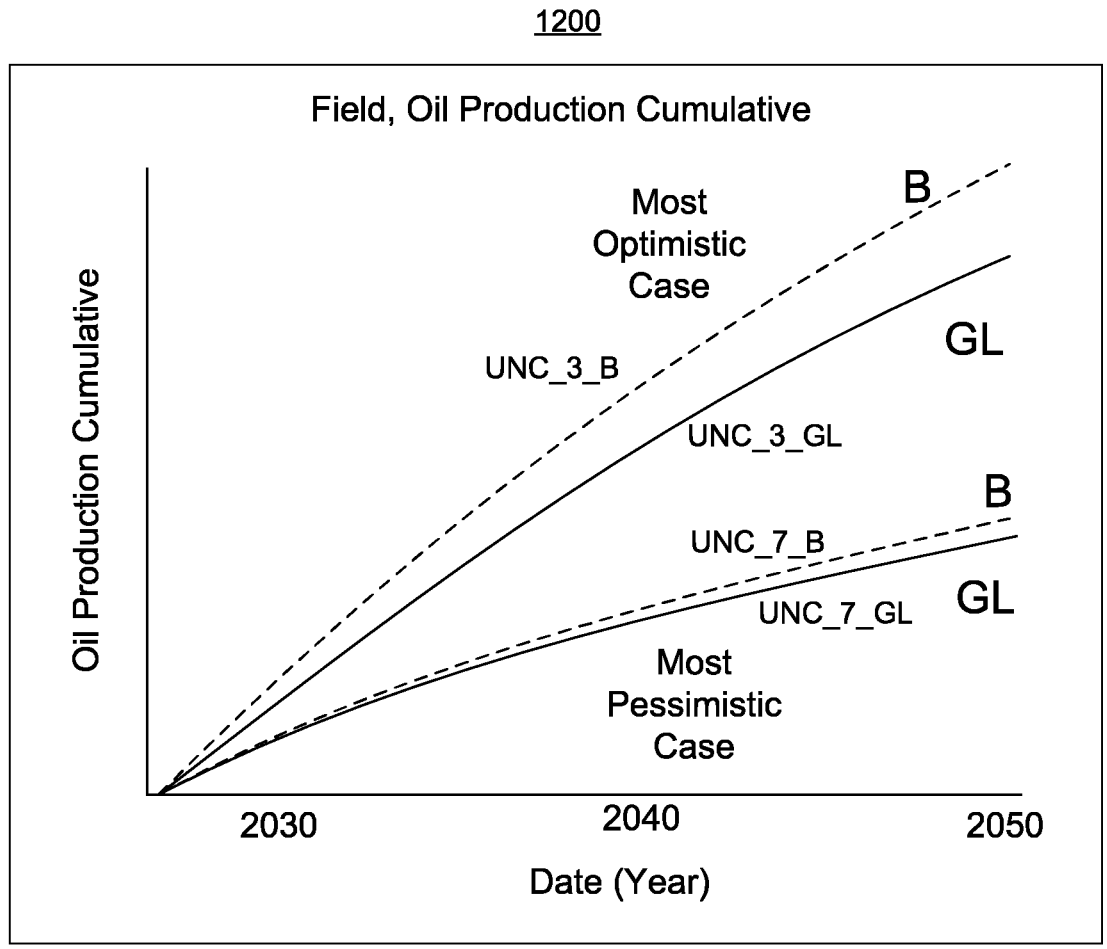
FIG. 12 illustrates a plot of several oil production cases, according to an embodiment.

FIG. 12 shows an example plot 1200 of curves labeled as corresponding to optimistic and pessimistic cases, as may be extracted, P10, P50 and P90 cases or others degrees of confidence, etc. As shown, such curves can depend, for example, upon one or more selected strategies. For example, the plot 1200 shows curves for a boosting strategy (B) and curves for a gas lifting strategy (GL).

As an example, an audit may be analyzed. For example, the audit block 270 can include analyzing audit results for acceptability; where, if not acceptable (e.g., not valid), the method 200 may restart at the definition block 210.

Figure 13:
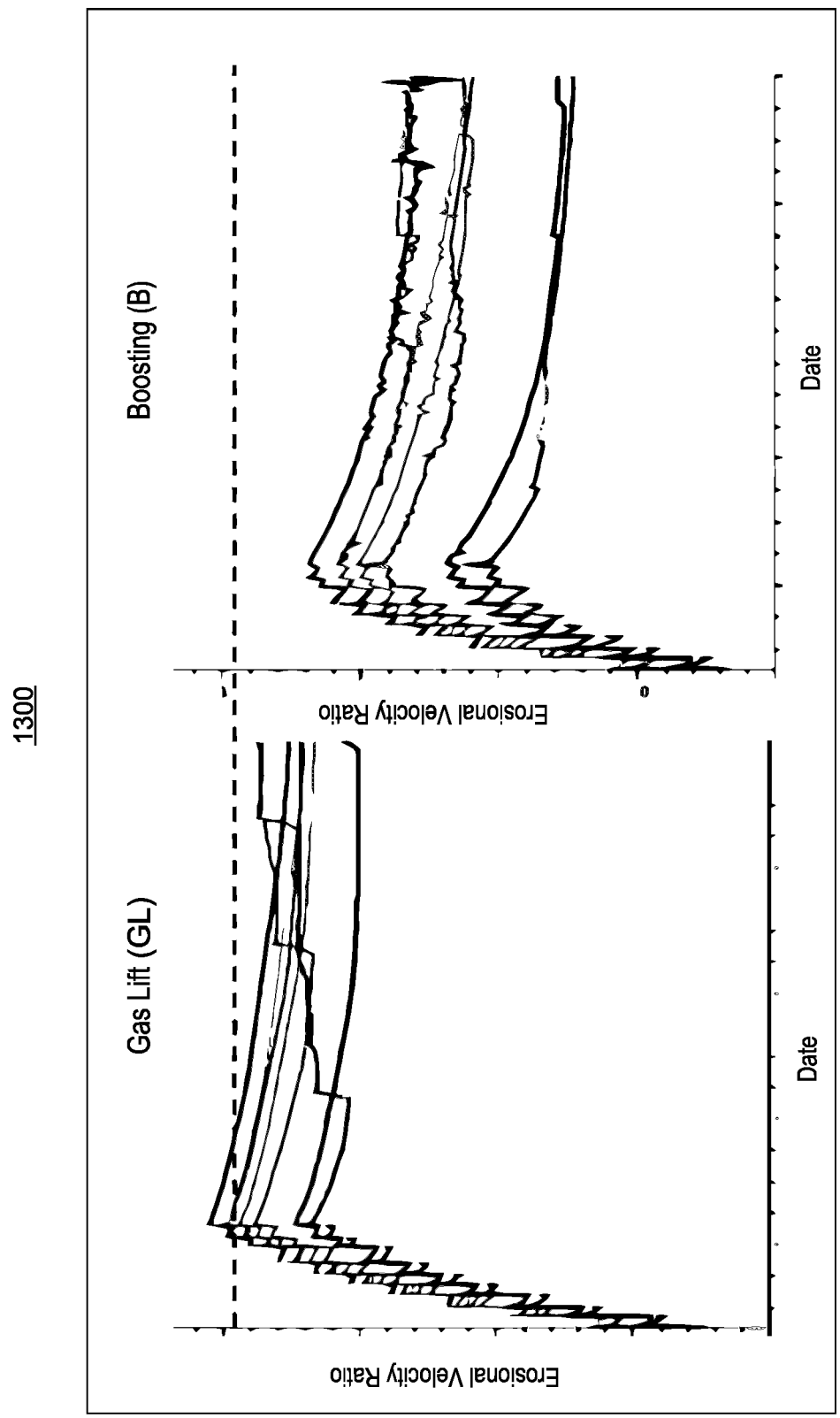
FIG. 13 illustrates plots of erosional velocity ratio for gas lift and boosting, according to an embodiment.

As an example, results may be audited for acceptability based on whether they are within one or more tolerances. For example, consider an erosional velocity limit due to flow rates due to choke setting or increased gas lift or boosting as shown in an example plot 1300 of FIG. 13. In such an example, if the results are not acceptable, then the method 200 may be restarted, for example, with one or more modified realizations, and re-run until an acceptable, satisfactory solution is found. As shown in the example method 200 of FIG. 2, if the audit results are acceptable, then the optimization under uncertainty for integrated models workflow may be complete. In such an example, implementation of at least a portion of the strategy may be undertaken. For example, one or more parameter values associated with an optimal strategy may be utilized to perform one or more operations, which may include one or more field operations, one or more off-site operations, etc.

Figure 14:
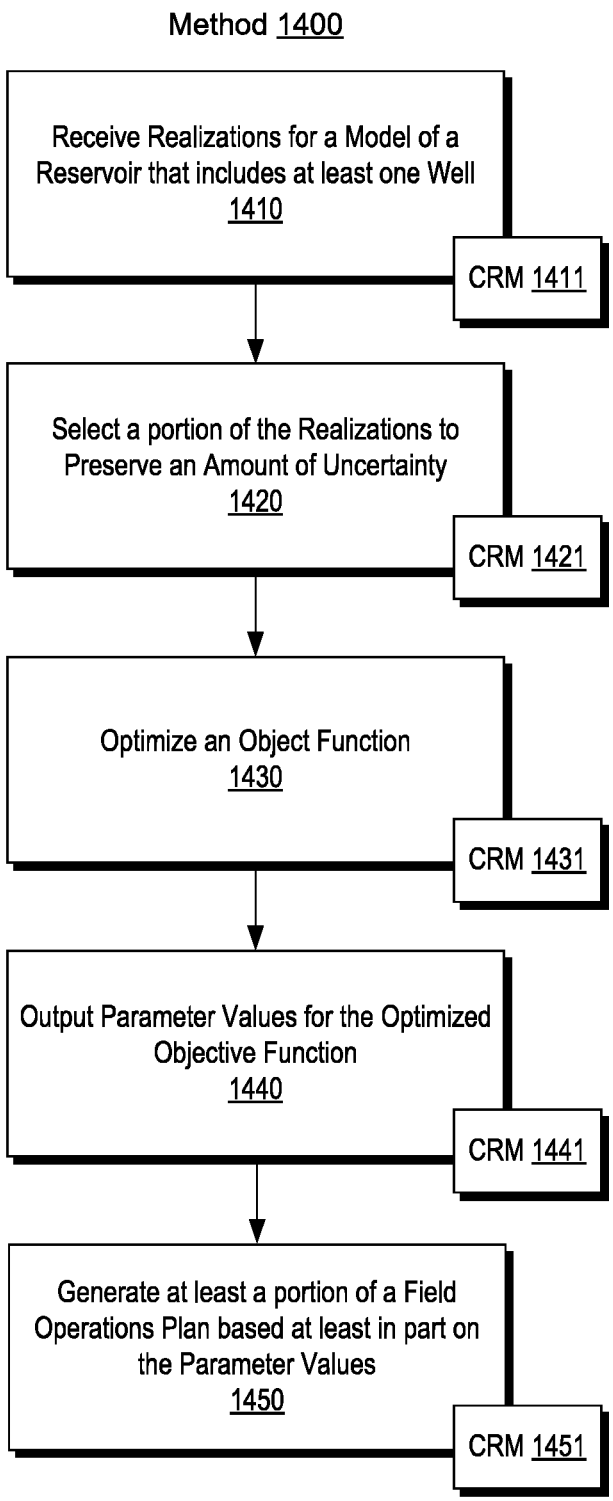
FIG. 14 illustrates an example of a method.

FIG. 14 shows an example of a method 1400 that includes a reception block 1410 for receiving realizations for a model of a reservoir that includes at least one well; a selection block 1420 for selecting a portion of the realizations to preserve an amount of uncertainty; an optimization block 1430 for optimizing an objective function; an output block 1440 for outputting parameter values for the optimized objective function; and a generation block 1450 for generating at least a portion of a field operations plan based at least in part on the parameter values.

The method 1400 can be associated with various computer-readable media (CRM) blocks 1411, 1421, 1431, 1441, and 1451. Such blocks generally include instructions suitable for execution by one or more processors (or cores) to instruct a computing device or system to perform one or more actions. As an example, a single medium may be configured with instructions to allow for, at least in part, performance of various actions of the method 1400. As an example, a computer-readable medium (CRM) may be a computer-readable storage medium that is non-transitory and not a carrier wave and not a signal.

In the example of FIG. 14, the field operations plan of the generation block 1450 can include parameters where at least some of those parameters may be assigned values output by the output block 1440. As an example, a field operations plan can include one or more well plans. A well plan can include a well trajectory that is to be followed to drill a well. As an example, a field operations plan can include one or more pieces of surface network equipment. As an example, a field operations plan can include an equipment schedule for maintenance, replacement, etc. of equipment. As an example, a field operations plan can include an operational schedule for operating one or more pieces of equipment (e.g., controlling one or more pieces of equipment such as, for example, a choke valve, a gas lift valve, an electric submersible pump, etc.).

In the example of FIG. 14, the optimization block 1430 can optimize an objective function that spans a period of time. For example, one of the at least one well can be a producing well that produces hydrocarbons over a period of time. In such an example, the production of hydrocarbons may depend on one or more parameter values, which may include time dependency. For example, a parameter value may be associated with a choke valve of the well, a parameter value may be associated with a gas lift rate, etc. As an example, a well may have a production curve over a period of time where a cumulative amount of hydrocarbons can be produced over that period of time. As an example, the rate of production over that period of time may change. For example, consider a production decline curve where production from a well declines over time. In such an example, factors such as choke valve setting(s) and/or gas lift rate(s) may affect a production decline curve for a well.

As an example, parameter values may include a series of parameter values for equipment control over a period of time. For example, consider a series of parameter values for control of a choke on a monthly basis over a period time that spans a year or more. As an example, output from an optimization may be a schedule of how to adjust a choke valve over a period of time.

As mentioned, uncertainty can exist as to various factors and a method such as the method 1400 can aim to represent such uncertainty with a particular number of realizations, which is less than a number of generated realizations. In such an example, the number of generated realizations may be statistically generated and then analyzed using, for example, an MDS approach whereby a selection process can appropriately select a number of the generated realizations, which is less than the total number, to reduce a problem for optimization while maintaining representative uncertainty.

As an example, the realizations of the reception block 1410 of the method 1400 can be defined with respect to a multidimensional space and the portion of the realizations of the selection block 1420 can be selected via selection of points in a reduce dimensional space, a space with a fewer number of dimensions than the multidimensional space of the realizations of the reception block 1410. In such an example, the reduced dimensional space may be a metric space, which may be generated via a technique such as, for example, multidimensional scaling (MDS). As an example, a clustering technique may be applied (e.g., kernel approach) to identify one or more clusters. As an example, a selection technique can include selecting representative realizations based on clusters where, for example, a point may be selected from an identified cluster of points in a metric space.

As an example, a method can include metric space modeling to reduce dimensionality of realizations from a multidimensional space to a reduced dimensionality metric space. In such an example, processes accompanied by modeling a reservoir or reservoirs may be reformulated and performed in metric space, where the location of a model is determined by mutual differences in responses as defined by a distance (a metric space distance). In such an example, a method can include defining a distance to construct a metric space for an initial set of multiple models and then representing the metric space by its projection to a low-dimensional space via a technique such as multidimensional scaling (MDS). In such an example, MDS can generate a map of points while maintaining the distance between pairs of two points. In such an example, MDS can allow for further analysis of an ensemble of multiple models via visual inspection and/or via one or more statistical analysis techniques. From a constructed metric space, a number of representative models may be selected. Such a selection process may utilize one or more approaches (e.g., screening, clustering, etc.). Dimensional reduction can, for example, transform a model, which may be an integrated model represented by millions of parameters (e.g., properties at each grid cell of a grid cell model, node of a surface network model, etc.), into metric space where the model is represented by a distance between other models that can be a distance that is correlated with the output of application (e.g., response of interest, etc.).

As an example, a distance in an MDS approach can be defined at least in part by response of a model, such as, for example, oil production, bottom hole pressure, etc., as may be obtained via simulation, etc.

As an example, an integrated model can be a model that includes heterogeneous models. For example, a reservoir model and a surface network model are heterogeneous models as one pertains to hydrocarbons in a reservoir and the other pertains to equipment for handling of hydrocarbons and optionally one or more other materials; whereas, two ECLIPSE® reservoir simulator flow models are homogenous models. As an example, an integrated model can include models of different frameworks, such that they are defined as heterogeneous models. As an example, an integrated model can have a response that depends on coupling of a plurality of models, which can include heterogeneous models.

Figure 15:
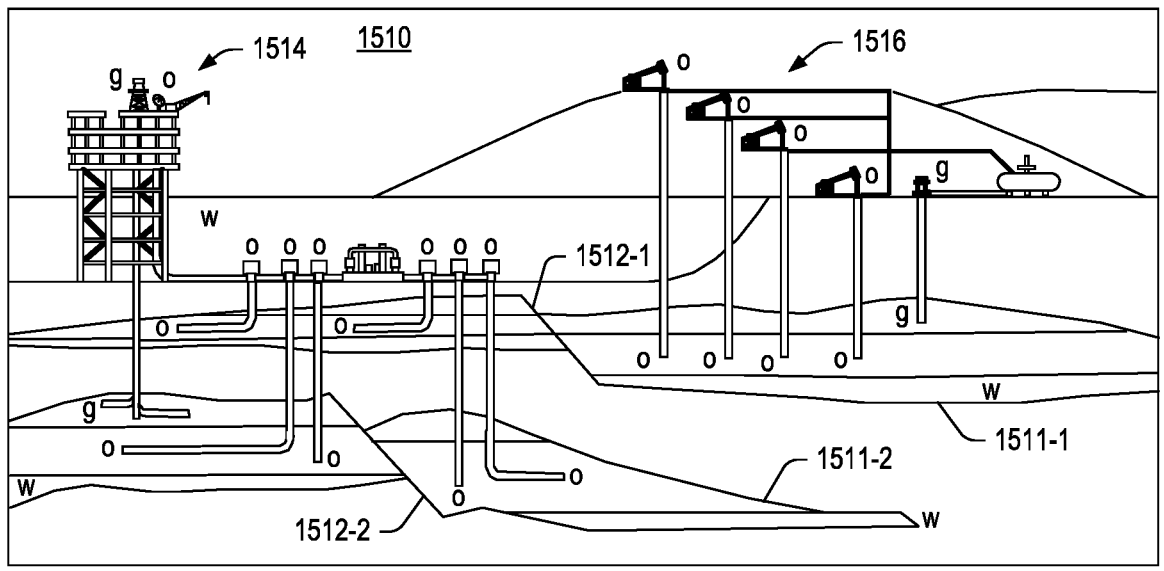
FIG. 15 illustrates examples of equipment in various geologic environments.
Figure 15:
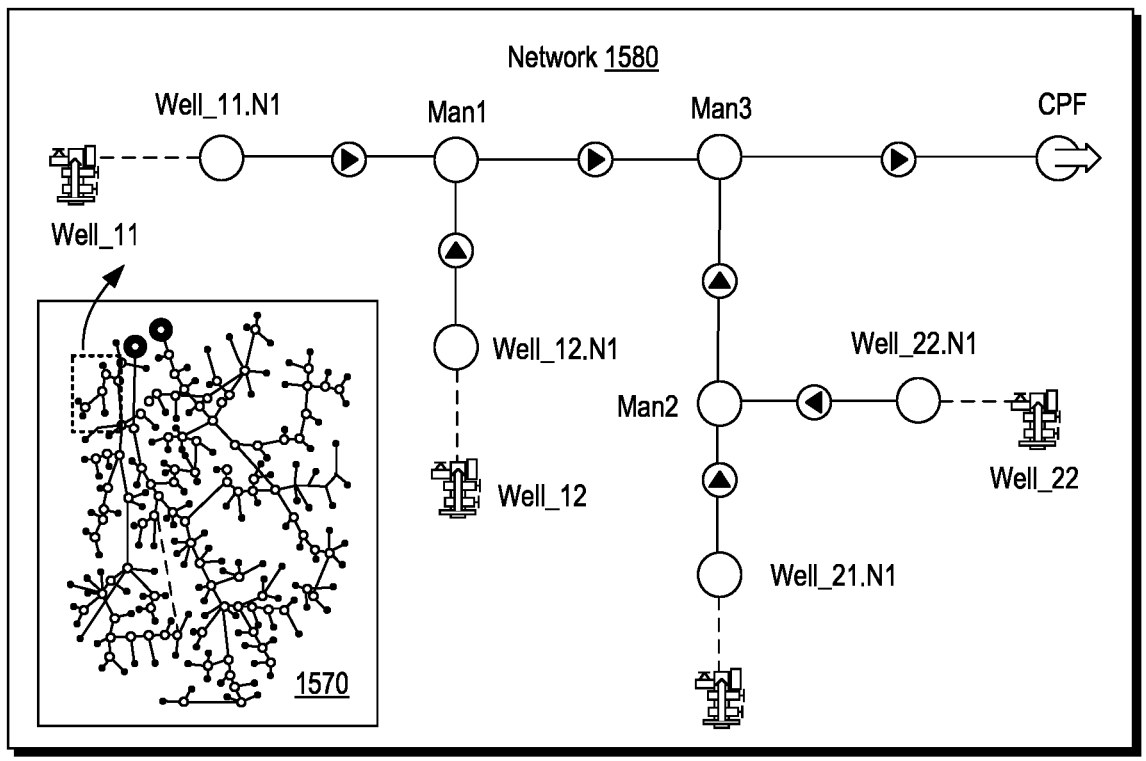

FIG. 15 shows an example of a geologic environment 1510 that includes reservoirs 1511-1 and 1511-2, which may be faulted by faults 1512-1 and 1512-2. FIG. 15 also shows some examples of offshore equipment 1514 for oil and gas operations related to the reservoirs 1511-1 and 1511-2 and onshore equipment 1516 for oil and gas operations related to the reservoir 1511-1.

As an example, a model may be made that models a geologic environment in combination with equipment, wells, etc. For example, a model may be a flow simulation model for use by a simulator to simulate flow in an oil, gas or oil and gas production system. Such a flow simulation model may include equations, for example, to model multiphase flow from a reservoir to a wellhead, from a wellhead to a reservoir, etc. A flow simulation model may also include equations that account for flowline and surface facility performance, for example, to perform a comprehensive production system analysis.

As an example, a flow simulation model may be a network model that includes various sub-networks specified using nodes, segments, branches, etc. As an example, a flow simulation model may be specified in a manner that provides for modeling of branched segments, multilateral segments, complex completions, intelligent downhole controls, etc. As an example, one or more portions of a production network (e.g., optionally sub-networks, etc.) or a group of signal components and/or controllers may be modeled as sub-models.

As an example, a system may provide for transportation of oil and gas fluids from well locations to processing facilities and may represent a substantial investment in infrastructure with both economic and environmental impact. Simulation of such a system, which may include hundreds or thousands of flow lines and production equipment interconnected at junctions to form a network, can involve multiphase flow science and, for example, use of engineering and mathematical techniques for large systems of equations.

As an example, a flow simulation model may include equations for performing nodal analysis, pressure-volume-temperature (PVT) analysis, gas lift analysis, erosion analysis, corrosion analysis, production analysis, injection analysis, etc. In such an example, one or more analyses may be based, in part, on a simulation of flow in a modeled network.

As to nodal analysis, it may provide for evaluation of well performance, for making decisions as to completions, etc. A nodal analysis may provide for an understanding of behavior of a system and optionally sensitivity of a system (e.g., production, injection, production and injection). For example, a system variable may be selected for investigation and a sensitivity analysis performed. Such an analysis may include plotting inflow and outflow of fluid at a nodal point or nodal points in the system, which may indicate where certain opportunities exist (e.g., for injection, for production, etc.).

A modeling framework may include components to facilitate generation of a flow simulation model. For example, a component may provide for modeling completions for vertical wells, completions for horizontal wells, completions for fractured wells, etc. A modeling framework may include modules for particular types of equations, for example, black-oil equations, equation-of-state (EOS) equations, etc. A modeling framework may include modules for artificial lift, for example, to model fluid injection, fluid pumping, etc. As an example, consider a component that includes features for modeling one or more electric submersible pumps (ESPs) (e.g., based in part on pump performance curves, motors, cables, etc.).

As an example, an analysis using a flow simulation model may be a network analysis to: identify production bottlenecks and constraints; assess benefits of new wells, additional pipelines, compression systems, etc.; calculate deliverability from field gathering systems; predict pressure and temperature profiles through flow paths; or plan full-field development.

As an example, a flow simulation model may provide for analyses with respect to future times, for example, to allow for optimization of production equipment, injection equipment, etc. As an example, consider an optimal time-based and conditional-event logic representation for daily field development operations that can be used to evaluate drilling of new developmental wells, installing additional processing facilities over time, choke-adjusted wells to meet production and operating limits, shutting in of depleting wells as reservoir conditions decline, etc.

As to equations, sets of conservation equations for mass momentum and energy describing single, two or three phase flow (e.g., according to one or more of a LEDAFLOW™ (Kongsberg Oil & Gas Technologies AS, Sandvika, Norway), OLGA™ model (Schlumberger Ltd, Houston, Texas), TUFFP unified mechanistic models (Tulsa University Fluid Flow Projects, Tulsa, Oklahoma), etc.).

FIG. 15 also shows an example of a relatively small production system network 1580 (e.g., optionally a portion of a larger network 1570). As shown, the network 1580 forms somewhat of a tree like structure where flowlines represent branches (e.g., segments) and junctions represent nodes. As shown in FIG. 15, the network 1580 provides for transportation of oil and gas fluids from well locations along flowlines interconnected at junctions with final delivery at a central processing facility.

In the example of FIG. 15, various portions of the network 1580 may include conduit, for example, consider two conduits which may be a conduit to Man1 and a conduit to Man3 in the network 1580. The conduits may be specified at various points by characteristics, which may be characteristics of the environment, characteristics of the conduits, characteristics of fluid in the conduits, etc. For example, consider conduit elevation, which may allow for determination of conduit inclination. As an example, consider conduit cross-sectional flow area, which may be defined by one or more parameters such as, for example, a conduit diameter. As an example, consider fluid that may flow in a conduit where the fluid may be characterized at least in part by a property such as, for example, viscosity. As an example, thermal conditions may optionally be considered such as, for example, latent heat, heat transfer, etc. As an example, thermal conditions may depend on insulation of equipment, temperature of an environment, wind, sun, rain, snow, etc. Such factors may be considered when assessing an existing network, developing a network, extending a network, etc.

As an example, given information of operating condition(s) at boundary nodes (e.g., where fluid enters and exists the system) and the physical environment between them (e.g., geographical location, elevation, ambient temperature, etc.), a production engineer may aim to design a production system that meets business and regulatory requirements constrained to operating limits of available equipment.

As an example, a method can include implementing one or more modules to simulate steady state operation of a production system, for example, as including a network (e.g., as a sub-network, etc.) as in the example of FIG. 15 (also see, e.g., FIG. 1). Such a method may include simulating the steady state operation over a selected range of operating conditions and configurations (e.g., optionally a broadest reasonable range).

As explained, a production system may provide for transportation of oil and gas fluids from well locations to a processing facility and can represent a substantial investment in infrastructure with both economic and environmental impact. Simulation of such a system, which may include hundreds or thousands of flow lines and production equipment interconnected at junctions to form a network, can be complex and involve multiphase flow science and engineering and mathematical methods to provide solutions (e.g., by solving large systems of non-linear equations). Factors associated with solid formation, corrosion and erosion, and environmental impact may increase complexity and cost.

As an example of a production network consider the Kashagan Island D, which is a structural development for field operations as connected with a plurality of wells (e.g., over 10 wells). The Island D includes trains of production for separating oil and gas and for delivering these fluids to an onshore plant and, for example, for dehydrating and partly re-injecting sour gas into the reservoir. Fluid is transported onshore by an approximately 92 kilometer long pipeline. Initial production is expected to be about 90,000 barrels per day (14,000 m$^3$/d), reaching a production rate of about 370,000 barrels per day (59,000 m$^3$/d).

As an example, the method 1400 of FIG. 14 may be implemented at a site such as a field site where various field operations are to be performed. As an example, during development of a site, such a method may be run more than once, for example, to optimize on-going development (e.g., to account for variations from a field operations plan, etc.). As an example, during production of hydrocarbons, information acquired may be utilized in one or more comparisons with respect to a generated field operations plan, which may inform a subsequent optimization, etc.

As an example, a method can include receiving realizations of a model of a reservoir that includes at least one well where the realizations represent uncertainty in a multidimensional space; selecting a portion of the realizations in a reduced dimensional space to preserve an amount of the uncertainty; optimizing an objective function based at least in part on the selected portion of the realizations; outputting parameter values for the optimized objective function; and generating at least a portion of a field operations plan based at least in part on at least a portion of the parameter values. In such an example, the realizations of the model can be or can include randomly generated realizations. As an example, realizations may be generated using one or more statistical techniques (e.g., sampling from distributions, etc.).

As an example, a method can include selecting a portion of realizations from a number of generated multidimensional space realizations via multidimensional scaling of the generated multidimensional space realizations to a reduced dimensional space where, for example, the reduced dimensional space can be a metric space. In such an example, clustering may be utilized. As an example, k-means clustering may be utilized, which can include vector quantization for partitioning n observations into k clusters in which each observation belongs to the cluster with the nearest mean, which can serve as a prototype of the cluster. As an example, k-means clustering may partition a space into Voronoi cells. As an example, a selection process can include selecting individual realizations (e.g., a model or instance of a model) from a plurality of individual clusters, which may be Voronoi cells.

As an example, a method can include weighting selected realizations. For example, the GUIs 910 and 920 of FIG. 9 show how a GUI may be implemented to allow for receipt of input that weights individual realizations, which are shown as individual cases. Such weights can then be utilized in an optimization routine that optimizes an objective function based at least in part on the selected realizations. As an example, a method may include equal weighting where the weights sum to unity or may include biased weighting where one or more realizations are weighted differently than one or more other realizations.

As an example, a method can include performing a sensitivity analysis on realizations of a model. In such an example, the method can include selecting a portion of the realizations via multidimensional scaling that is based at least in part on performing the sensitivity analysis.

As an example, a model can be an integrated model, which may be an integrated model of homogenous model types or an integrated model of heterogeneous model types. For example, an integrated model of heterogeneous model types can include a surface network model operatively coupled to a reservoir model or reservoir models. As an example, a model can be an integrated model of a surface network model operatively coupled to a plurality of reservoir models.

As an example, an objective function can accounts for equipment condition. In such an example, the objective function can be penalized for equipment failure. In such an example, the objective function can account for time, which may be, for example, a period of years. In such an example, where one or more pieces of equipment deteriorate in their condition, failure may occur, which can then penalize the objective function such that an optimization process may seek alternatives where equipment failure does not occur, does not occur to such an extent, is delayed in time (e.g., to a lower production rate period of time), etc. As an example, data and/or models of equipment condition may be received and utilized as part of a method.

As an example, a method can include optimizing an objective function to optimize cumulative production of hydrocarbons from a reservoir.

As an example, parameter values from an optimization can include at least one time dependent series of parameter values. For example, consider at least one time dependent series of parameter values that includes a time dependent series of well choke valve parameter values for a well or wells and/or a time dependent series of gas lift parameter values for a well or wells.

As an example, a method can include rendering a graphical user interface to a display and linking output from at least two modeling frameworks to generate the model, which can be an integrated model.

As an example, a method can include generating at least a portion of a field operations plan based at least in part on parameter values from an optimization of an objective function for a selected number of realizations and, for example, auditing at least a portion of the parameter values for a plurality of realizations, which may optionally exceed the selected number of realizations.

As an example, a method can include receiving a risk factor value and modifying an objective function based at least in part on the risk factor value.

As an example, a system can include a processor; memory accessible by the processor; processor-executable instructions stored in the memory and executable to instruct the system to: receive realizations of a model of a reservoir that includes at least one well where the realizations represent uncertainty in a multidimensional space; select a portion of the realizations in a reduced dimensional space to preserve an amount of the uncertainty; optimize an objective function based at least in part on the selected portion of the realizations; output parameter values for the optimized objective function; and generate at least a portion of a field operations plan based at least in part on at least a portion of the parameter values. In such an example, the model can be an integrated model. For example, consider an integrated model of a surface network model operatively coupled to the reservoir model. As an example, a system can implement an objective function that accounts for equipment condition where such equipment may be equipment to be utilized in a field operation or operations.

As an example, a system can include processor-executable instructions to receive a risk factor value and to modify an objective function based at least in part on the risk factor value.

As an example, one or more computer-readable storage media can include processor-executable instructions to instruct a computing system to: receive realizations of a model of a reservoir that includes at least one well where the realizations represent uncertainty in a multidimensional space; select a portion of the realizations in a reduced dimensional space to preserve an amount of the uncertainty; optimize an objective function based at least in part on the selected portion of the realizations; output parameter values for the optimized objective function; and generate at least a portion of a field operations plan based at least in part on at least a portion of the parameter values.

As an example, method for modeling a reservoir can include defining a plurality of reservoir realizations; conducting a sensitivity analysis on the plurality of reservoir realizations; selecting one or more uncertain reservoir realizations based on the sensitivity analysis; determining uncertainty by combining reservoir uncertainty with equipment failure, using an objective function; determining an operating strategy based on the uncertainty; and validating the operating strategy by applying optimal strategy to each of the plurality of realizations.

As an example, a computing system can include one or more processors; and a memory system that includes one or more non-transitory computer-readable media storing instructions that, when executed by at least one of the one or more processors, cause the computing system to perform operations, the operations including: defining a plurality of reservoir realizations; conducting a sensitivity analysis on the plurality of reservoir realizations; selecting one or more uncertain reservoir realizations based on the sensitivity analysis; determining uncertainty by combining reservoir uncertainty with equipment failure, using an objective function; determining an operating strategy based on the uncertainty; and validating the operating strategy by applying optimal strategy to each of the plurality of realizations.

As an example, a non-transitory computer-readable medium can store instructions that, when executed by one or more processors of a computing system, cause the computing system to perform operations, the operations including: defining a plurality of reservoir realizations; conducting a sensitivity analysis on the plurality of reservoir realizations; selecting one or more uncertain reservoir realizations based on the sensitivity analysis; determining uncertainty by combining reservoir uncertainty with equipment failure, using an objective function; determining an operating strategy based on the uncertainty; and validating the operating strategy by applying optimal strategy to each of the plurality of realizations.

Figure 16:
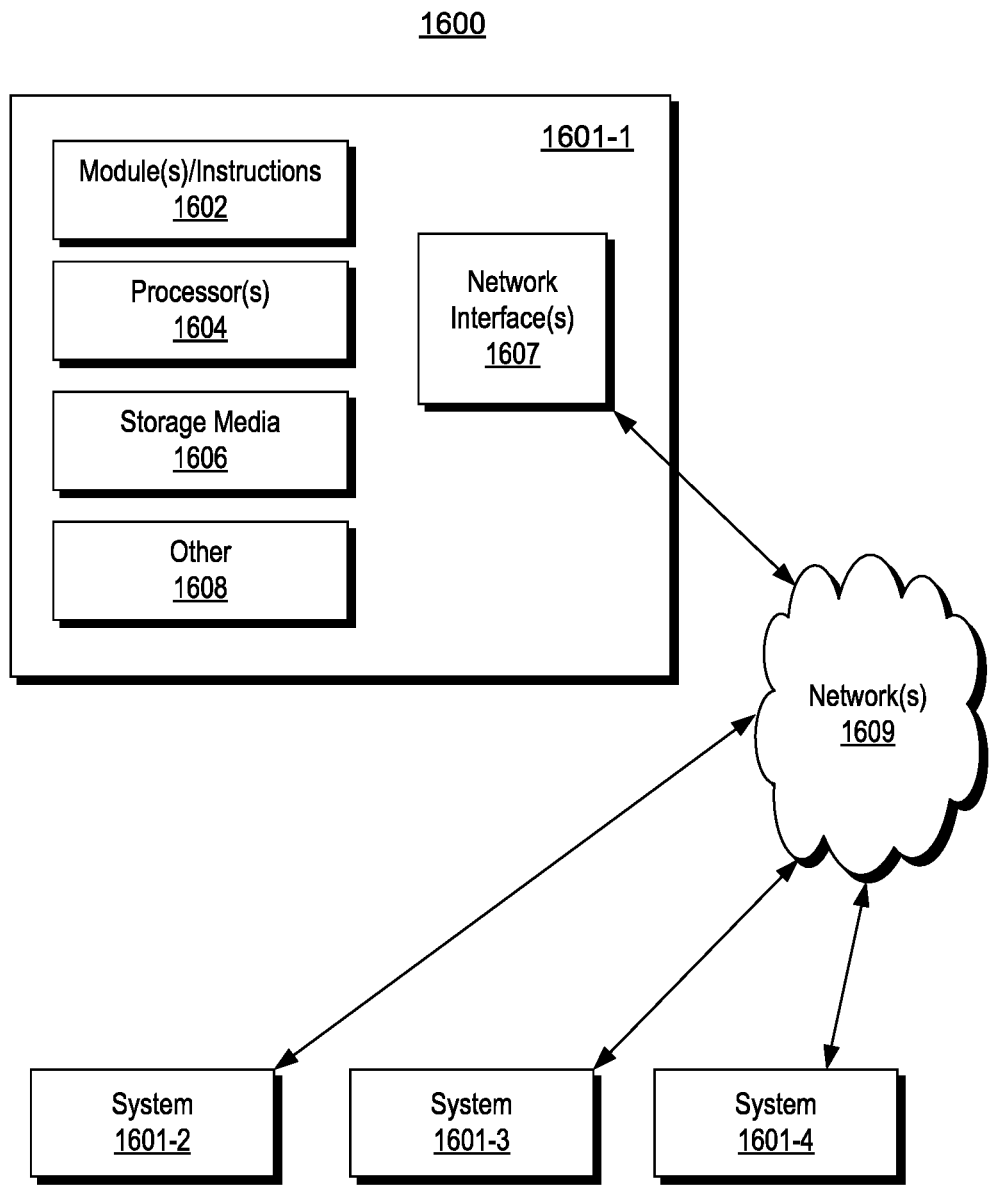
FIG. 16 illustrates a schematic view of a computing system, according to an embodiment.

In some embodiments, the methods of the present disclosure may be executed by a computing system. FIG. 16 illustrates an example of such a computing system 1600, in accordance with some embodiments. The computing system 1600 may include a computer or computer system 1601-1, which may be an individual computer system 1601-1 or an arrangement of distributed computer systems. The computer system 1601-1 includes one or more analysis modules 1602 that are configured to perform various tasks according to some embodiments, such as one or more methods disclosed herein. To perform these various tasks, the analysis module/instructions 1602 executes independently, or in coordination with, one or more processors 1604, which is (or are) connected to one or more storage media 1606. The processor(s) 1604 is (or are) also connected to a network interface 1607 to allow the computer system 1601-1 to communicate over a data network 1609 with one or more additional computer systems and/or computing systems, such as 1601-2, 1601-3, and/or 1601-4 (note that computer systems 1601-2, 1601-3 and/or 1601-4 may or may not share the same architecture as computer system 1601-1, and may be located in different physical locations, e.g., computer systems 1601-1 and 1601-2 may be located in a processing facility, while in communication with one or more computer systems such as 1601-3 and/or 1601-4 that are located in one or more data centers, and/or located in varying countries on different continents).

A processor may include a microprocessor, microcontroller, processor module or subsystem, programmable integrated circuit, programmable gate array, or another control or computing device.

The storage media 1606 may be implemented as one or more computer-readable or machine-readable storage media. Note that while in the example embodiment of FIG. 16 storage media 1606 is depicted as within computer system 1601-1, in some embodiments, storage media 1606 may be distributed within and/or across multiple internal and/or external enclosures of computing system 1601-1 and/or additional computing systems. Storage media 1606 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 1600 contains one or more asset modeling module(s) 1608. In the example of computing system 1600, computer system 1601-1 includes the asset modeling module 1608. In some embodiments, a single asset modeling module may be used to perform some aspects of one or more embodiments of the methods disclosed herein. In other embodiments, a plurality of asset modeling modules may be used to perform some aspects of methods herein.

The computing system 1600 is merely one example of a computing system, and that computing system 1600 may have more or fewer components than shown, may combine additional components not depicted in the example embodiment of FIG. 16, and/or computing system 1600 may have a different configuration or arrangement of the components depicted in FIG. 16. The various components shown in FIG. 16 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of the present disclosure.

Geologic interpretations, models, and/or other interpretation aids may be refined in an iterative fashion; this concept is applicable to the methods discussed herein. This may include use of feedback loops executed on an algorithmic basis, such as at a computing device (e.g., computing system 1600, FIG. 16), and/or through manual control by a user who may make determinations regarding whether a given step, action, template, model, or set of curves has become sufficiently accurate for the evaluation of the subsurface three-dimensional geologic formation under consideration.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method, comprising:
inputting realizations of a model of a reservoir that comprises at least one well into a computing system comprising a processor, wherein the realizations represent an uncertainty in a multidimensional space;
wherein the processor is configured to reduce run-time overhead by:
selecting a portion of the realizations in a reduced dimensional space to maintain a same amount of the uncertainty,
wherein the portion of realizations is less than a number of the realizations, and
wherein the same amount of the uncertainty is maintained by using multidimensional scaling of the realizations to reduce dimensionality of the realizations,
generating a parameter value by performing a preliminary optimization of an objective function that is based on the portion of the realizations,
running, based on the parameter value, the model to generate a field operations plan; and
adjusting operation of one or more pieces of wellbore equipment based on the field operations plan generated from the model to maximize production of hydrocarbons from one or more reservoirs.

2. The method of claim 1 wherein the realizations of the model comprise randomly generated realizations.

3. The method of claim 1 wherein the reduced dimensional space is a metric space.

4. The method of claim 1 wherein the selecting comprises performing a sensitivity analysis on the realizations of the model.

5. The method of claim 4 wherein the multidimensional scaling is based at least in part on performing the sensitivity analysis.

6. The method of claim 1 wherein the model comprises an integrated model of a surface network model operatively coupled to a reservoir model.

7. The method of claim 1 wherein the model comprises an integrated model of a surface network model operatively coupled to a plurality of reservoir models.

8. The method of claim 1 wherein the objective function accounts for equipment condition.

9. The method of claim 8 wherein the objective function is penalized for equipment failure.

10. The method of claim 1 wherein the preliminary optimization optimizes cumulative production of hydrocarbons from the reservoir.

11. The method of claim 1 wherein the parameter value comprises at least one time dependent series of parameter values.

12. The method of claim 11 wherein the at least one time dependent series of parameter values comprises a time dependent series of well choke valve parameter values.

13. The method of claim 11 wherein the at least one time dependent series of parameter values comprises a time dependent series of gas lift parameter values.

14. The method of claim 1 further comprising:
rendering a graphical user interface to a display, and
linking output from at least two modeling frameworks to generate the model.

15. The method of claim 1 further comprising:
generating at least a portion of the field operations plan based on auditing the parameter value for a plurality of the realizations.

16. The method of claim 1 further comprising receiving a risk factor value and modifying the objective function based at least in part on the risk factor value.

17. The method of claim 1 wherein the adjusting operation of the one or more pieces of wellbore equipment comprises at least one of installing additional processing facilities, installing choke-adjusted wells, and shutting in of depleting wells.

18. The method of claim 1 wherein the parameter value comprises a series of parameter values for control of a choke valve of the at least one well on a monthly basis over a period time that spans a year or more, and wherein the field operations plan comprises a schedule of how to adjust the choke valve over the period of time based on the series of parameter values.

19. The method of claim 18 wherein the adjusting operation of the one or more pieces of wellbore equipment comprises adjusting a choke valve setting of one or more choke valves based on the schedule.

* * * * *